(12) United States Patent
Chang et al.

(10) Patent No.: US 9,353,996 B2
(45) Date of Patent: *May 31, 2016

(54) PRESSURE DIFFERENCE DRIVEN HEAT SPREADER

(75) Inventors: Shyy-Woei Chang, Sinjhuang (TW); Kuei-Feng Chiang, Sinjhuang (TW)

(73) Assignee: Asia Vital Components Co., Ltd., Sinjhuang (TW)

( * ) Notice: Subject to any disclaimer, the term of this patent is extended or adjusted under 35 U.S.C. 154(b) by 697 days.

This patent is subject to a terminal disclaimer.

(21) Appl. No.: 12/870,854

(22) Filed: Aug. 30, 2010

(65) Prior Publication Data

US 2012/0018131 A1    Jan. 26, 2012

(30) Foreign Application Priority Data

Jul. 21, 2010 (TW) ................................ 099123954

(51) Int. Cl.

| | |
|---|---|
| F28D 15/00 | (2006.01) |
| F28D 15/02 | (2006.01) |
| F28F 9/22 | (2006.01) |
| F28F 13/08 | (2006.01) |
| G06F 1/20 | (2006.01) |
| H01L 23/427 | (2006.01) |

(52) U.S. Cl.
CPC .............. F28D 15/0266 (2013.01); F28F 9/22 (2013.01); F28F 13/08 (2013.01); G06F 1/203 (2013.01); H01L 23/427 (2013.01); F28F 2009/222 (2013.01); H01L 2924/0002 (2013.01)

(58) Field of Classification Search
CPC ........ F28D 15/0266; F28F 9/22; F28F 13/08; H01L 23/427

USPC ................ 165/104.19, 104.21, 104.22, 80.4, 165/104.26, 104.33, 128, 130
See application file for complete search history.

(56) References Cited

U.S. PATENT DOCUMENTS

| | | | |
|---|---|---|---|
| 6,253,835 B1 * | 7/2001 | Chu et al. ...................... | 165/80.4 |
| 8,256,501 B2 * | 9/2012 | Nagai et al. ................... | 165/80.4 |
| 2003/0079863 A1 * | 5/2003 | Sugito et al. ............. | 165/104.21 |
| 2006/0157227 A1 * | 7/2006 | Choi et al. ............... | 165/104.21 |
| 2007/0227704 A1 * | 10/2007 | Nagai et al. .............. | 165/104.33 |

* cited by examiner

*Primary Examiner* — Marc Norman
*Assistant Examiner* — Jon T Schermerhorn
(74) *Attorney, Agent, or Firm* — C. G. Mersereau; Nikolai & Mersereau, P.A.

(57) ABSTRACT

A pressure difference driven heat spreader includes a chamber defined in a main body; a vaporizing section arranged in the chamber and including a plurality of first flow-guiding members spaced from one another to define first flow passages therebetween, the first flow passages each having at least one free end communicating with a free zone; a condensing section arranged in the chamber opposite to the vaporizing section and including a plurality of second flow-guiding members spaced from one another to define second flow passages therebetween; and an interconnecting section arranged between the vaporizing and condensing sections and having first and second communicating holes for communicating the vaporizing section with the condensing section. The condensing section functions as a low-pressure end, so that a pressure gradient is produced in the pressure difference driven heat spreader to drive steam-water circulation therein, and no wick structure is needed for driving the working fluid.

19 Claims, 25 Drawing Sheets

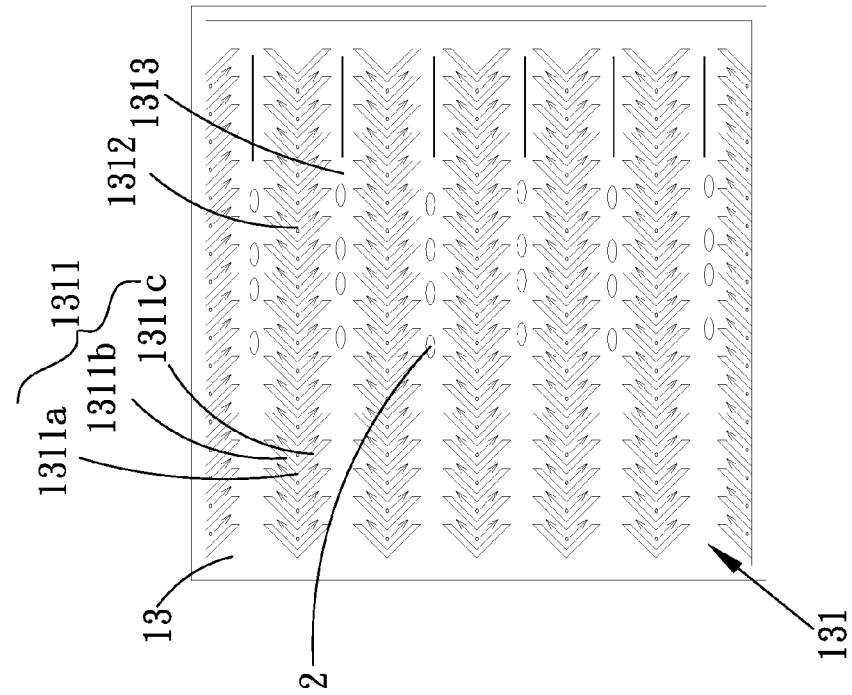
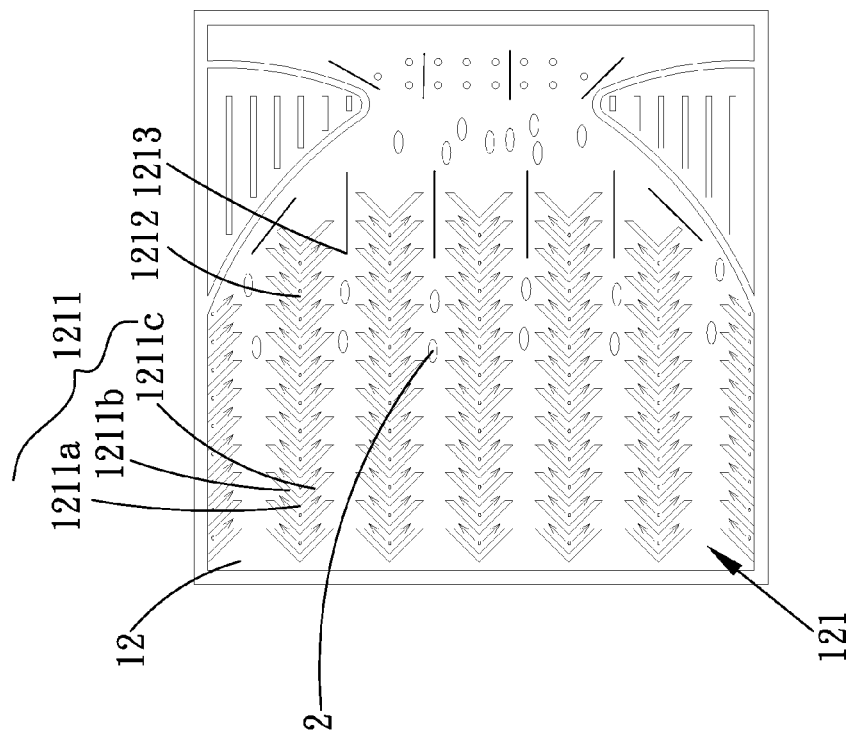
Fig. 3b
Fig. 3a

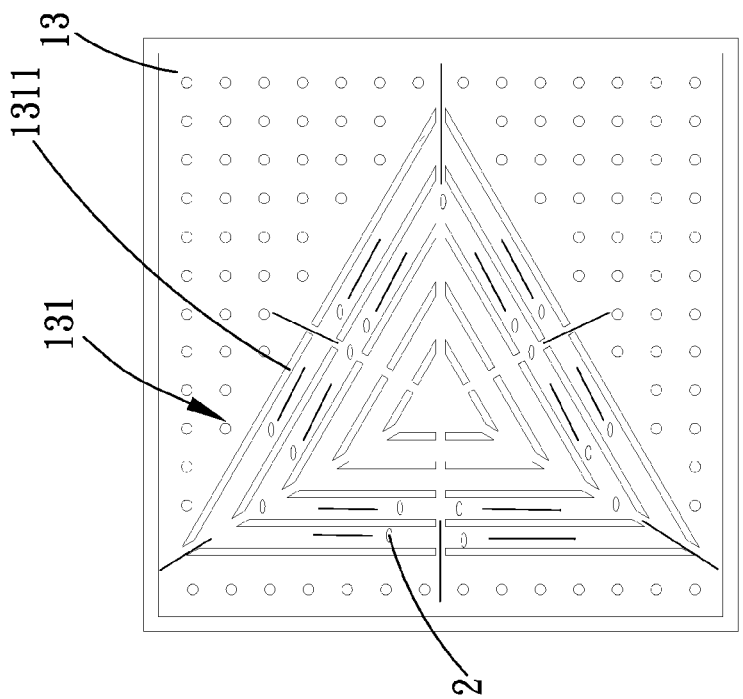
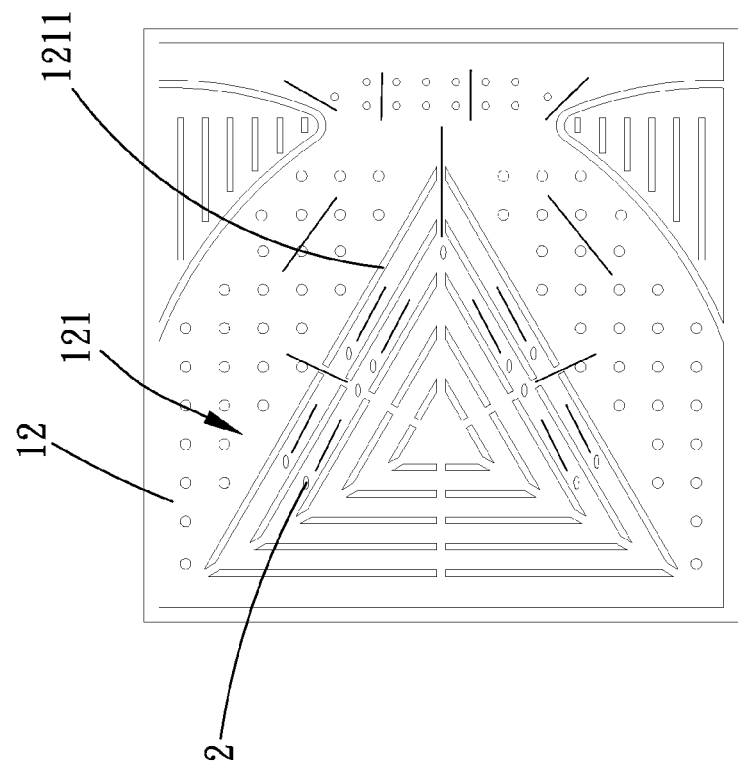
Fig. 5a
Fig. 5b

PRESSURE DIFFERENCE DRIVEN HEAT SPREADER

This application claims the priority benefit of Taiwan patent application number 099123954 filed on Jul. 21, 2010.

FIELD OF THE INVENTION

The present invention relates to a pressure difference driven heat spreader, and more particularly to a pressure difference driven heat spreader that can transfer heat without the need of any internal wick structure for driving the working fluid and can therefore be manufactured with largely reduced cost.

BACKGROUND OF THE INVENTION

With the prosperous development in the electronic semiconductor industry, the progress in the process technique and the trends in the market demands, all kinds of electronic devices have been designed to be compact, low-profile and light in weight. However, while the electronic devices have gradually reduced dimensions, they have increasing functions and computing ability. For example, the notebook computer and the desktop computer, which account for the largest part of products in the information industry, include many electronic elements that would produce heat during the operation thereof. Among others, the central processing unit (CPU) produces the largest part of heat in the computer. Under this circumstance, a heat sink formed from radiating fins and cooling fans for dissipating heat plays an important role in protecting the CPU against overheating, so that the CPU can be maintained at a normal working temperature to fully extend its intended functions. Therefore, the CPU heat sink is a very important component in nowadays information industry.

In recent years, water cooling technique has been widely applied in the personal computer. In the water cooling technique, the large-volume radiating fins are omitted, and heat from the heat sources in the computer system is collected and transferred to the working fluid. Then, the heat-absorbed working fluid exchanges heat with air via a heat exchanger. Since the length of the pipeline for water cooling can be changed according to actual need, the heat exchanger (i.e. the radiating fins) can be flexibly disposed at different positions and can be advantageously designed without spatial restriction. However, a water cooling system requires a pump to drive the working fluid to flow in the pipeline, and a water tank to store sufficient water as the working fluid. That is, the water cooling system is subject to the reliability of the pump, possible leakage in the pipeline, and the like. However, due to the increasing heat produced by the heat-producing element in the personal computer, the water-cooling heat dissipating technique, though not so perfect for use, is still the best choice in the current market for heat management and control. While the water cooling technique can be well applied to the personal computer that has a relatively large volume and is not subject to any spatial restriction, the water cooling technique for heat dissipation seems useless at all in terms of the notebook computer that is compact, low-profile and small volume in design. Therefore, for the present, heat pipes are still used in the notebook computer for heat transfer, and radiating fins are further used to exchange heat with ambient air. Besides the heat pipes and the radiating fins, what the notebook computer can do to protect the CPU is to lower the power consumption of the CPU as much as possible. In view of these problems, the information industry and other related electronic industries all have positively tried to find other heat dissipation techniques capable of providing higher heat flux, so as to meet the growing demands for heat dissipation.

In the conventional heat dissipation techniques, heat pipe and uniform temperature plate are also used as heat transfer elements. In manufacturing the heat pipe and the uniform temperature plate, a sintered layer is formed on the inner wall surface thereof to serve as a wick structure. To form the sintered layer, first fill a type of metal (copper) particles or powder in the inner wall of the heat pipe and the uniform temperature plate, and then tightly press the copper particles or powder before sintering the metal particles or powder in a sinter furnace to form a porous wick structure. While the sintered layer provides a capillary force, it also increases an overall thickness of the heat pipe and the uniform temperature plate, preventing the latter from being effectively slimmed. As to the currently known vapor chamber (VC), it uses a sintered core, grids, or grooves to produce the capillary force for driving steam-water circulation in the heat pipe or the vapor chamber. However, the above structure is not ideal for use because it involves in a very complicated manufacturing process and accordingly, increased manufacturing cost.

Moreover, the selection of a vapor core is not easy. It is very important to select a proper vapor core, which must be able to keep the condensate at a desired flowing speed and must be able to maintain sufficient capillary pressure to overcome any undesired influence from the force of gravity on the vapor and the condensate.

In brief, the prior art heat pipe or vapor chamber has the following disadvantages: (1) uneasy to fabricate; (2) unable to be slimmed; (3) high manufacturing cost; and (4) consuming time and labor to manufacture.

SUMMARY OF THE INVENTION

A primary object of the present invention is to provide a pressure difference driven heat spreader, with which no internal wick structure is needed to drive the working fluid in the heat spreader to transfer heat, and the cost of manufacturing the heat spreader can be largely reduced.

Another object of the present invention is to provide a pressure difference driven heat spreader with high heat transfer efficiency.

To achieve the above and other objects, the pressure difference driven heat spreader according to the present invention includes a main body, a chamber, a vaporizing section, a condensing section, and an interconnecting section. The chamber is defined in the main body. The vaporizing section is arranged in the chamber and includes a plurality of first flow-guiding portions, each of which includes a plurality of first flow-guiding members spaced from one another, so that at least one first flow passage is formed between two adjacent first flow-guiding members. The first flow passages have at least one end being a free end communicating with a free zone. The condensing section is arranged in the chamber opposite to the vaporizing section and includes a plurality of second flow-guiding portions, each of which includes a plurality of second flow-guiding members spaced from one another, so that at least one second flow passage is formed between two adjacent second flow-guiding members. The interconnecting section is arranged between the vaporizing section and the condensing section, and is provided with at least one set of first communicating holes and one set of second communicating holes to communicate the vaporizing section with the condensing section.

In the pressure difference driven heat spreader of the present invention, a first flow passage is properly defined between any two flow-guiding members, so that overheated vapor is produced in the first flow passages, which are in contact with a heat source, to provide high pressure needed to drive steam-water circulation in the heat spreader. Further, with a proper pressure releasing design, a low-pressure end is form at the condensing section to produce a pressure gradient needed to drive steam-water circulation in the pressure difference driven heat spreader. That is, with the present invention, no internal wick structure is needed to drive the working fluid in the heat spreader to transfer heat. In addition, the heat transfer efficiency of the heat spreader can be largely upgraded while the manufacturing cost thereof can be largely reduced.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 1b is an assembled view of FIG. 1a;

FIG. 1c is another exploded perspective view of the pressure difference driven heat spreader of FIG. 1a;

FIG. 1d is an assembled sectional view of the pressure difference driven heat spreader of FIG. 1a;

FIG. 1e is another assembled sectional view of the pressure difference driven heat spreader of FIG. 1a;

FIG. 1f is a top view of a first variant of a vaporizing section for the pressure difference driven heat spreader of FIG. 1a;

FIG. 1g is a bottom view of a first variant of a condensing section for the pressure difference driven heat spreader of FIG. 1a;

FIG. 1h is a top view of a second variant of the vaporizing section for the pressure difference driven heat spreader of FIG. 1a;

FIG. 1i is a bottom view of a second variant of the condensing section for the pressure difference driven heat spreader of FIG. 1a;

FIG. 2a is a top view of a third variant of the vaporizing section for the pressure difference driven heat spreader of FIG. 1a;

FIG. 2b is a bottom view of a third variant of the condensing section for the pressure difference driven heat spreader of FIG. 1a;

FIG. 3a is a top view of a vaporizing section for a pressure difference driven heat spreader according to a second embodiment of the present invention;

FIG. 3b is a bottom view of a condensing section for the pressure difference driven heat spreader according to the second embodiment of the present invention;

FIG. 5a is a top view of a first variant of the vaporizing section for the pressure difference driven heat spreader according to the third embodiment of the present invention;

FIG. 5b is a bottom view of a first variant of the condensing section for the pressure difference driven heat spreader according to the third embodiment of the present invention;

DETAILED DESCRIPTION OF THE PREFERRED EMBODIMENTS

Figure 1A:
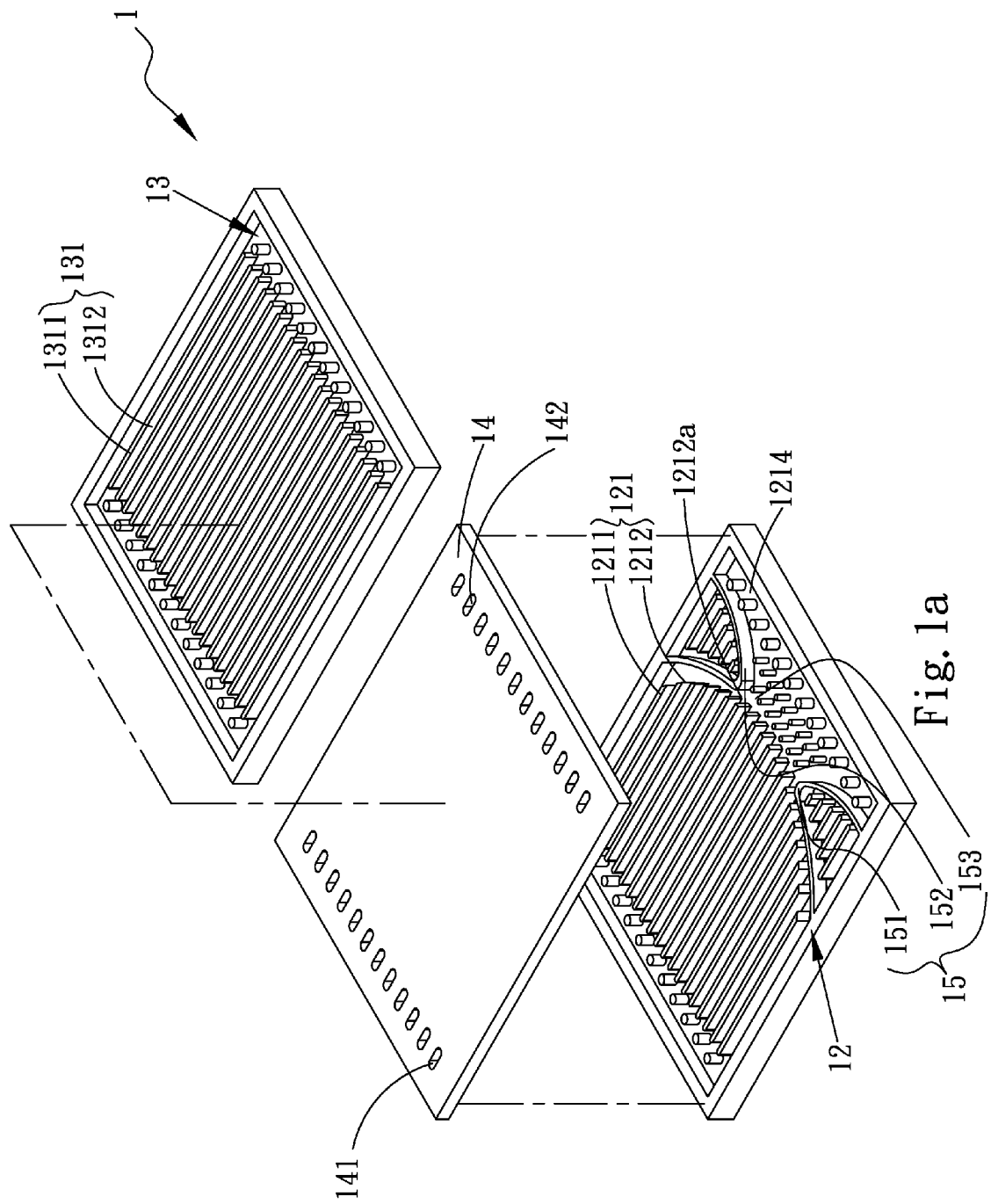
FIG. 1a is an exploded perspective view of a pressure difference driven heat spreader according to a first and preferred embodiment of the present invention.
Figure 1B:
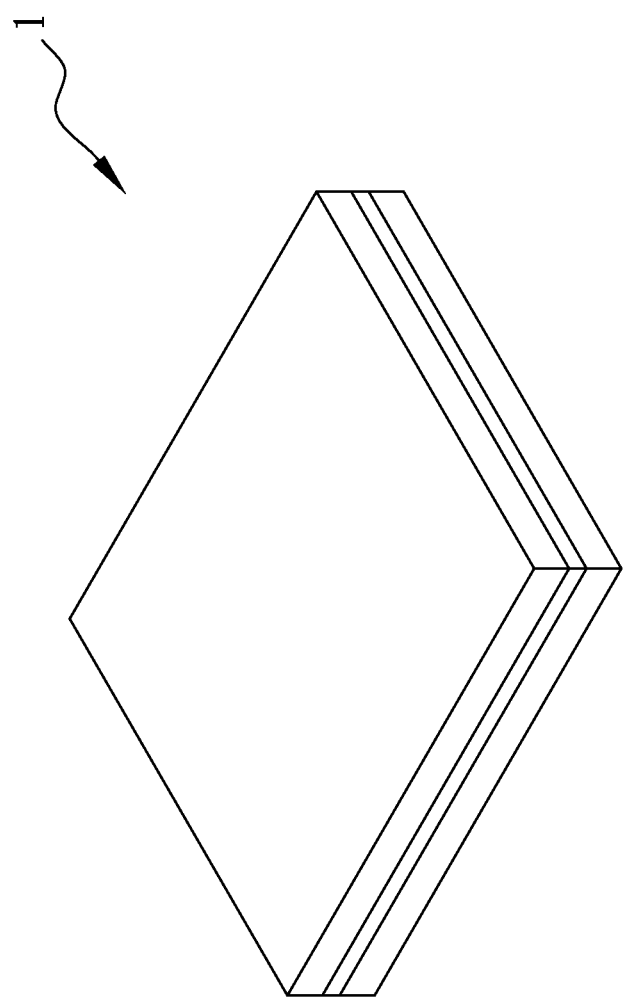
Figure 1C:
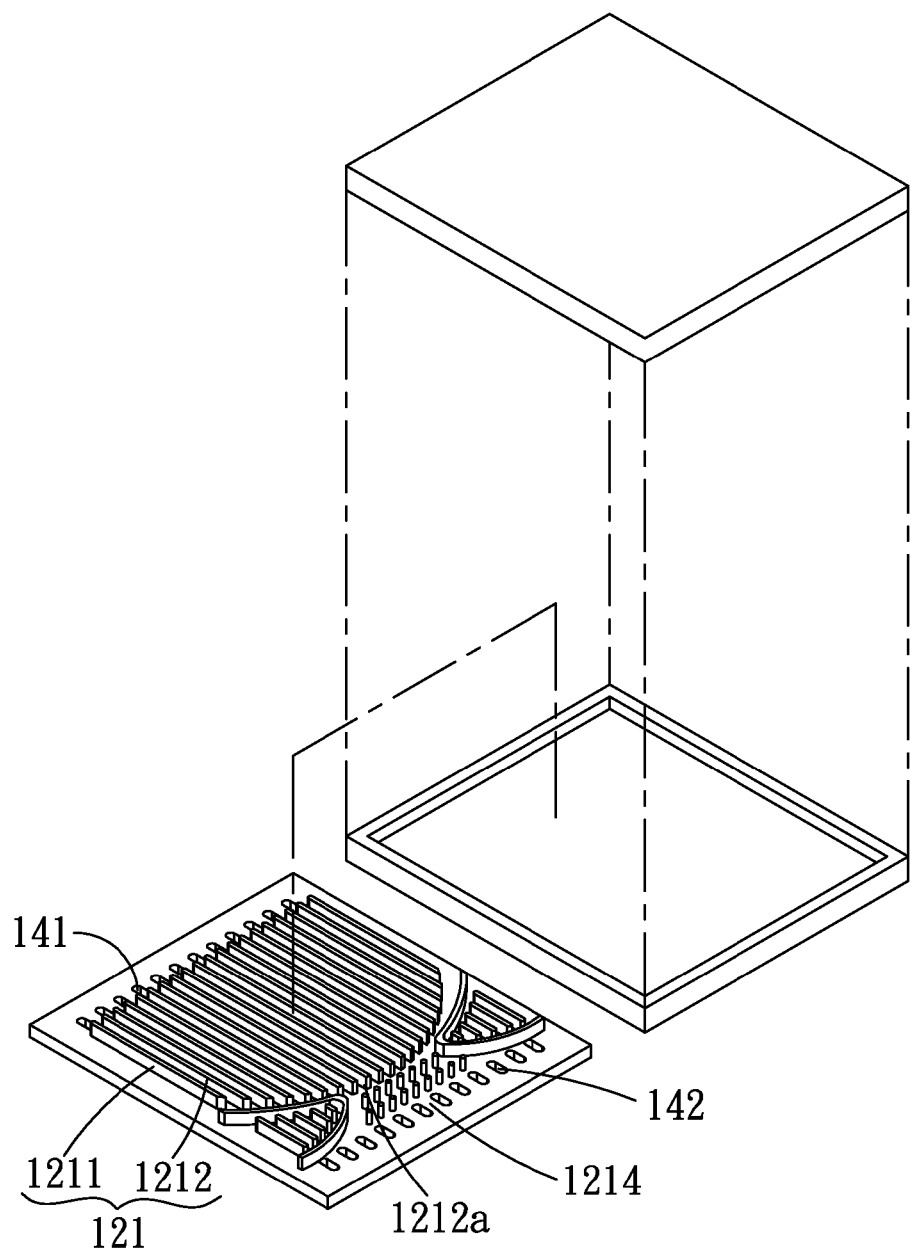
Figure 1E:
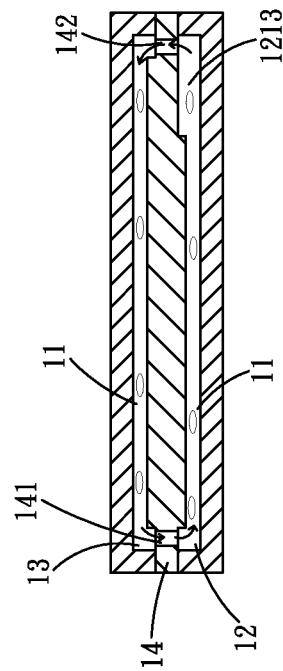
Figure 1D:
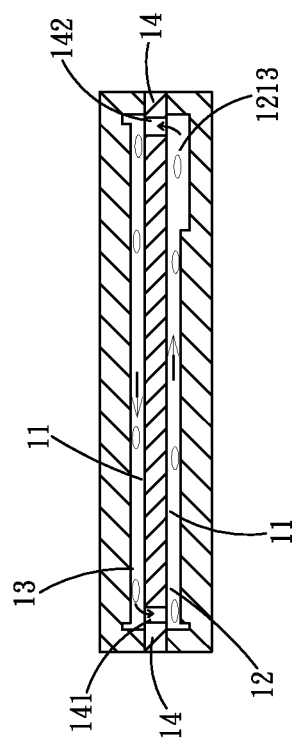

The present invention will now be described with some preferred embodiments thereof. For the purpose of easy to understand, elements that are the same in the preferred embodiments are denoted by the same reference numerals.

Please refer to FIGS. 1a-1i and FIGS. 2a-2b, in which some variants of a pressure difference driven heat spreader according to a first and preferred embodiment of the present invention are shown. The pressure difference driven heat spreader includes a main body 1, a chamber 11, a vaporizing section 12, a condensing section 13, and an interconnecting section 14.

The chamber 11 is defined in the main body 1. The vaporizing section 12 is arranged in the chamber 11, and includes a plurality of first flow-guiding portions 121 and a guiding portion 15. The first flow-guiding portions 121 each is formed from a plurality of arrayed and spaced first flow-guiding members 1211, such that at least one first flow passage 1212 is formed between two adjacent first flow-guiding members 1211. The first flow passages 1212 each have at least one end being a free end 1212a communicating with a free zone 1214. The guiding portion 15 has a first guiding member 151 and a second guiding member 152. The first guiding member 151 and the second guiding member 152 are located between the first flow-guiding members 1211 and the free zone 1214 and extended respectively from two lateral walls of the chamber 11 to a center to define a necked opening 153. The necked opening 153 is positioned between the vaporizing section 12 and the free zone 1214.

Figure 1F:
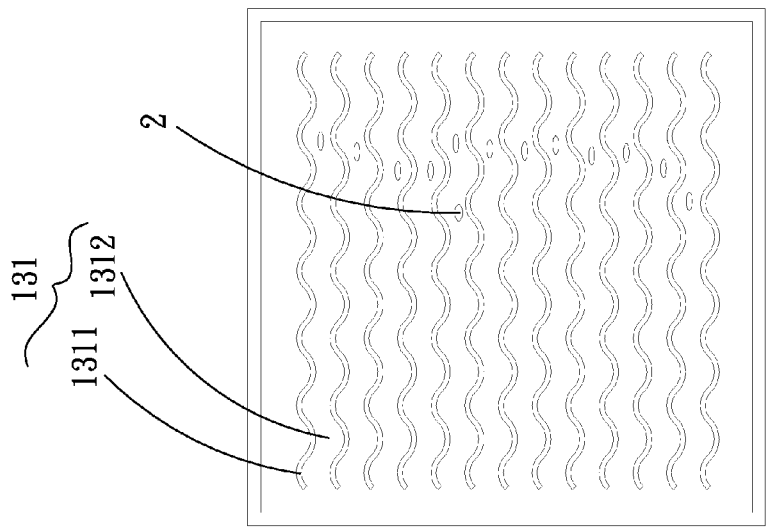

In the illustrated first and preferred embodiment, the first flow-guiding members 1211 are respectively an elongated rib. The elongated ribs are transversely arrayed and spaced from one another, and the first flow passages 1212 are formed between adjacent elongated ribs. According to a first variant of the vaporizing section 12, each of the elongated ribs can be extended in a wave form, as shown in FIG. 1f.

Figure 1G:
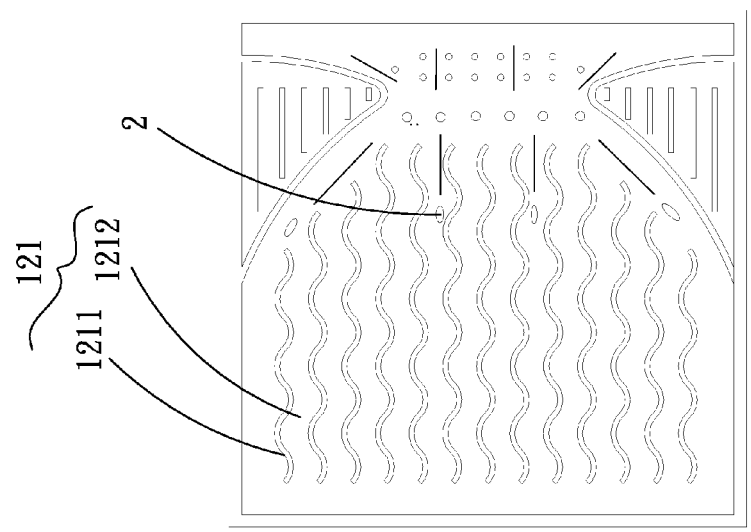
Figure 1I:
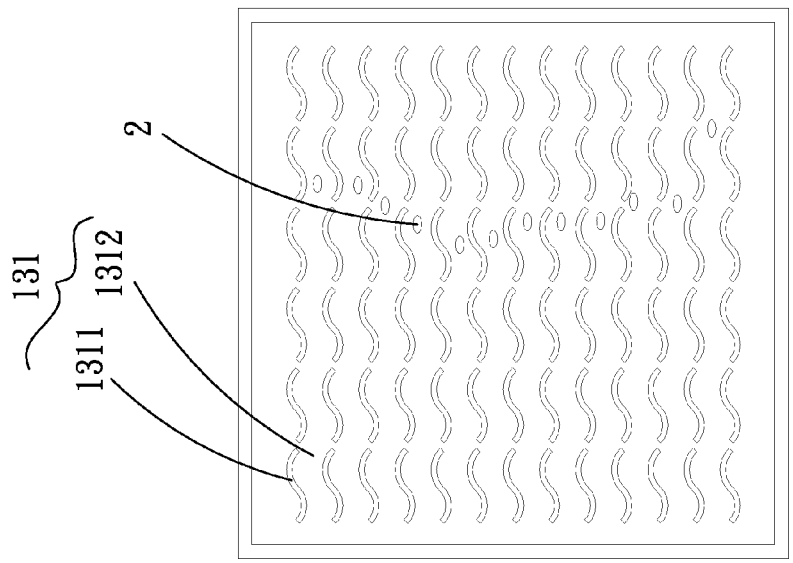
Figure 1H:
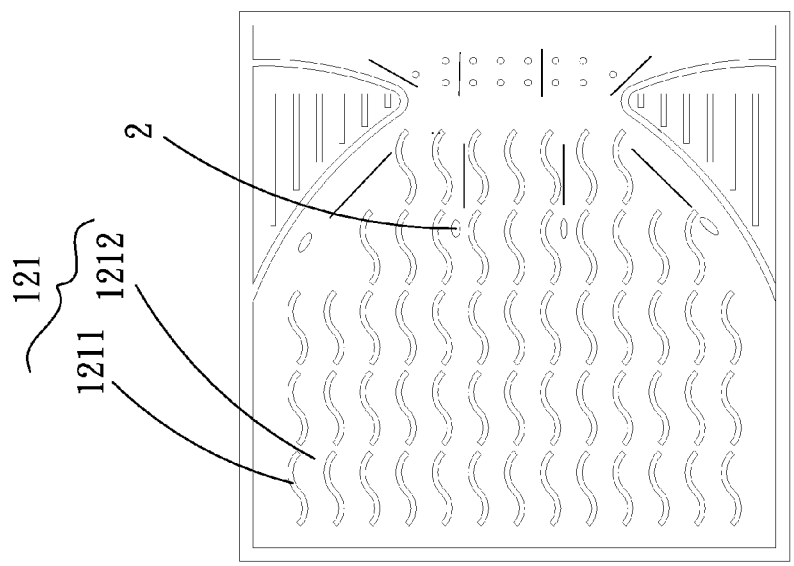
Figure 2B:
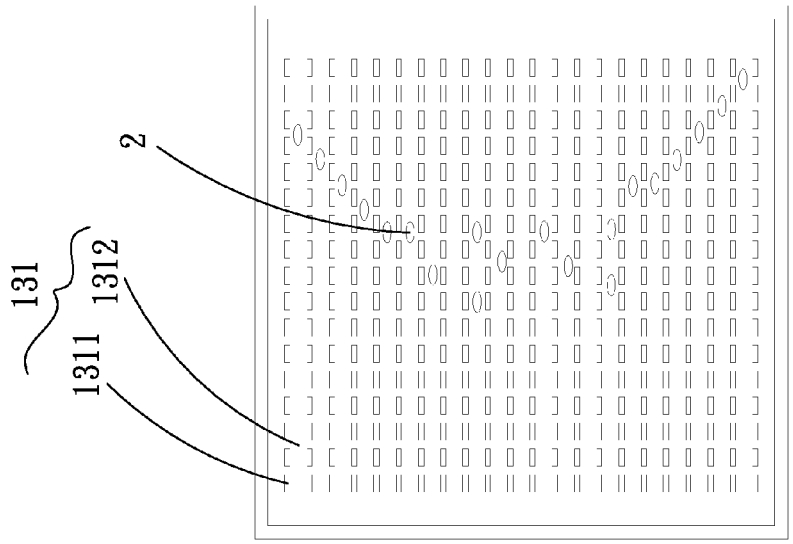
Figure 2A:
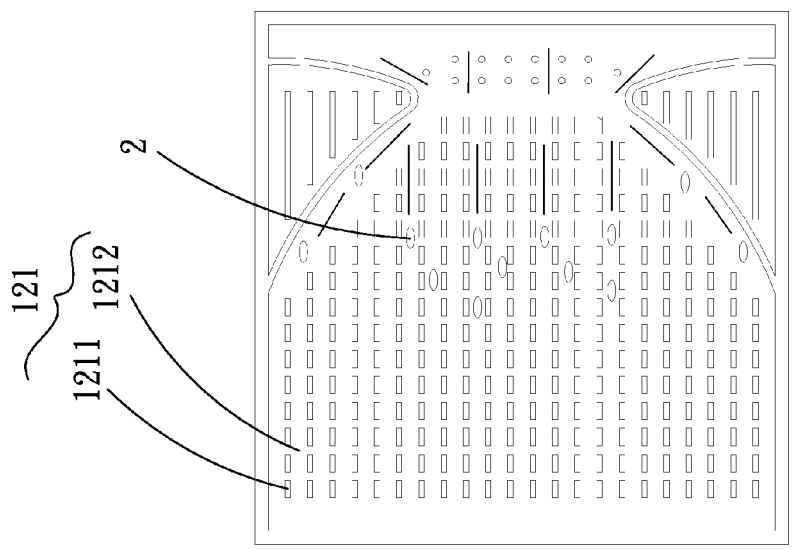

It is also possible for a plurality of the first flow-guiding members 1211 to be longitudinally arrayed and spaced from one another, as a second and a third variant of the vaporizing section 12 shown in FIGS. 1h and 2a, respectively. That is, the first flow-guiding members 1211 are discontinuously arrayed in a longitudinal direction.

The condensing section 13 is arranged in the chamber 11 opposite to the vaporizing section 12, and includes a plurality of second flow-guiding portions 131. The second flow-guiding portions 131 each is formed from a plurality of arrayed and spaced second flow-guiding members 1311, such that at least one second flow passage 1312 is formed between two second flow-guiding members 1311.

In the illustrated first and preferred embodiment, the second flow-guiding members 1311 are respectively an elongated rib. The elongated ribs are transversely arrayed and spaced from one another, and the second flow passages 1312 are formed between adjacent elongated ribs. According to a first variant of the condensing section 13, each of the elongated ribs can be extended in a wave form, as shown in FIG. 1g.

It is also possible for a plurality of the second flow-guiding members 1311 to be longitudinally arrayed and spaced from one another, as a second and a third variant of the condensing section 13 shown in FIGS. 1i and 2b, respectively. That is, the second flow-guiding members 1311 are discontinuously arrayed in a longitudinal direction.

The interconnecting section 14 is arranged between the vaporizing section 12 and the condensing section 13, and includes at least one set of first communicating holes 141 and at least one set of second communicating holes 142. The first and the second communicating holes 141, 142 communicate the vaporizing section 12 with the condensing section 13.

Please refer to FIGS. 3a and 3b, in which a vaporizing section 12 and a condensing section 13 of a pressure difference driven heat spreader according to a second embodiment of the present invention are respectively shown. Since the second embodiment is generally similar to the first and preferred embodiment in a part of the structure and the component connection thereof, these similar portions are not repeatedly described in details. The second embodiment is different from the first embodiment in that each of the first flow-guiding members 1211 for the vaporizing section 12 is a substantially V-shaped rib having a first vertex angle 1211a, a first edge 1211b, and a second edge 1211c. The first and the second edge 1211b, 1211c meet each other at the first vertex angle 1211a. The first flow passages 1212 are respectively formed between two adjacent first flow-guiding members 1211. And, a first space 1213 is left between two adjacent first flow-guiding portions 121.

Figure 3D:
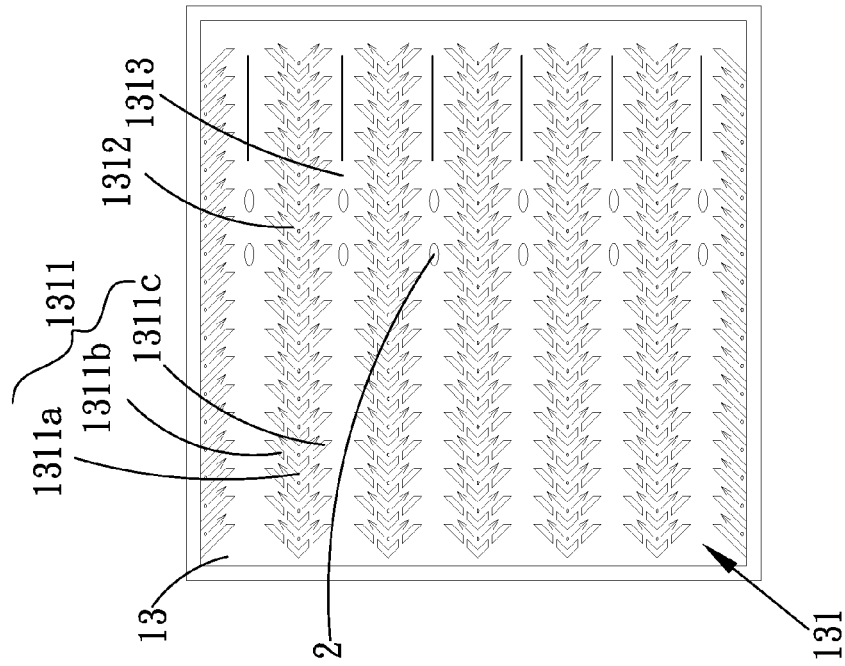
FIG. 3d is a bottom view of a variant of the condensing section for the pressure difference driven heat spreader according to the second embodiment of the present invention.
Figure 3C:
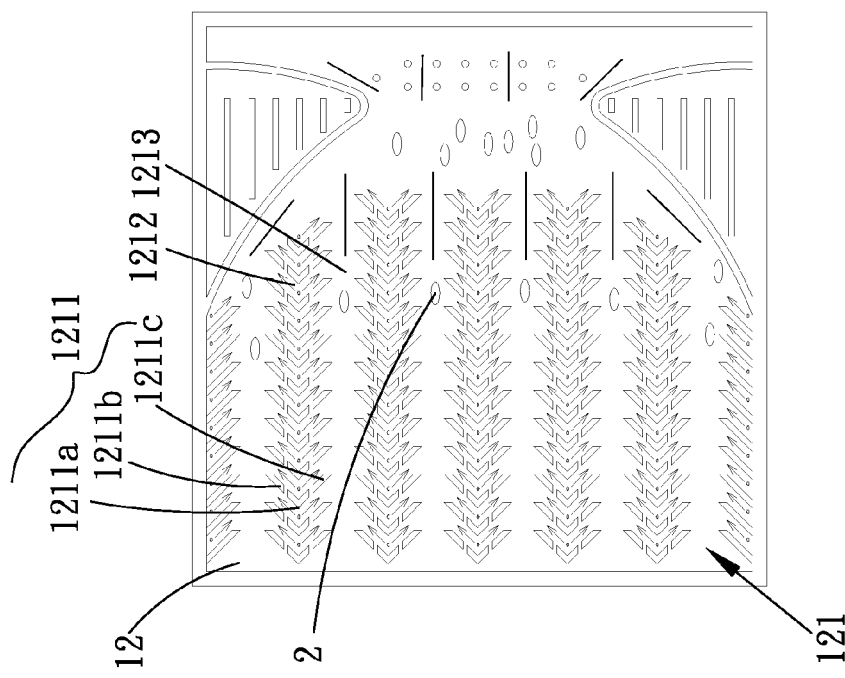
FIG. 3c is a top view of a variant of the vaporizing section for the pressure difference driven heat spreader according to the second embodiment of the present invention.

Each of the first flow-guiding members 1211 can also include a plurality of discontinuously arrayed first edges 1211b and second edges 1211c, as a variant of the vaporizing section 12 shown in FIG. 3c.

The second embodiment is also different from the first embodiment in that each of the second flow-guiding members 1311 of the condensing section 13 in the second embodiment is a substantially V-shaped rib having a second vertex angle 1311a, a third edge 1311b, and a fourth edge 1311c. The third and the fourth edge 1311b, 1311c meet each other at the vertex angle 1311a. The second flow passages 1312 are respectively formed between two adjacent second flow-guiding members 1311. And, a second space 1313 is left between two adjacent second flow-guiding portions 131.

Each of the second flow-guiding members 1311 can also include a plurality of discontinuously arrayed third edges 1311b and fourth edges 1311c, as a variant of the condensing section 13 shown in FIG. 3d.

Figure 4A:
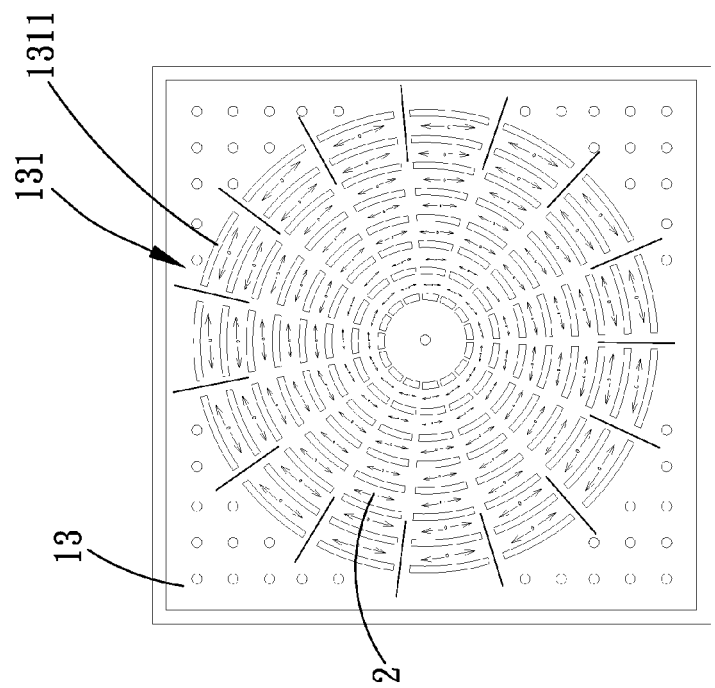
FIG. 4a is a top view of a vaporizing section for a pressure difference driven heat spreader according to a third embodiment of the present invention.

Please refer to FIGS. 4a-4b, 5a-5b, 6a-6b, 7a-7b, and 8a-8b, in which some variants of the vaporizing section 12 and the condensing section 13 of a pressure difference driven heat spreader according to a third embodiment of the present invention are shown. Since the third embodiment is generally similar to the first and preferred embodiment in a part of the structure and the component connection thereof, these similar portions are not repeatedly described in details. The third embodiment is different from the first and preferred embodiment in that each of the first flow-guiding members 1211 of the first flow-guiding portions 121 of the vaporizing section 12 in the third embodiment is a rib, and the first flow-guiding members 1211 are annularly arrayed and spaced to form a plurality of concentric circles, as shown in FIG. 4a.

Figure 4B:
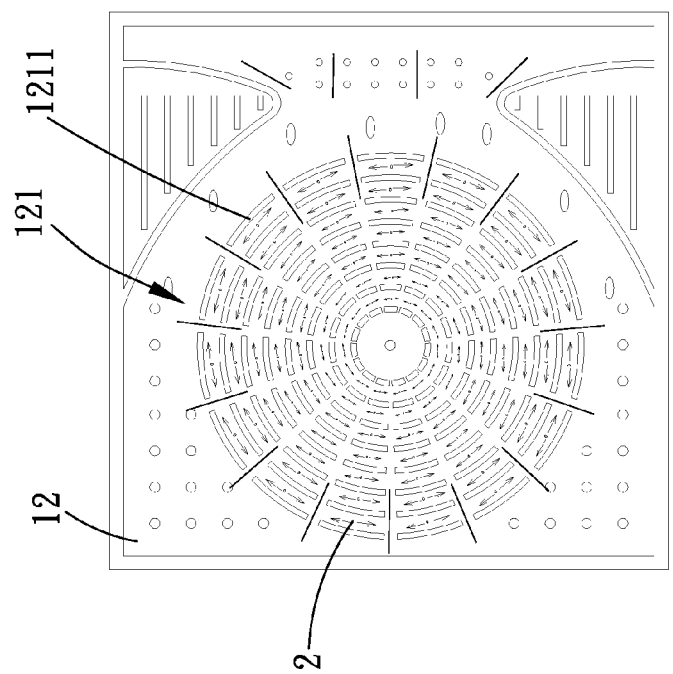
FIG. 4b is a bottom view of a condensing section for the pressure difference driven heat spreader according to the third embodiment of the present invention.

The third embodiment is also different from the first and preferred embodiment in that each of the second flow-guiding members 1311 of the second flow-guiding portions 131 of the condensing section 13 in the third embodiment is a rib, and the second flow-guiding members 1311 are annularly arrayed and spaced to form a plurality of concentric circles, as shown in FIG. 4b.

Figure 6B:
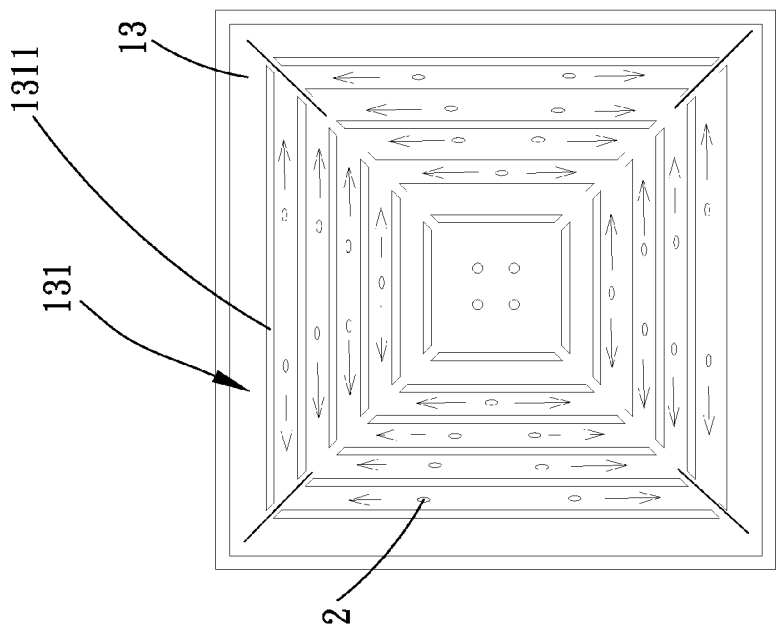
FIG. 6b is a bottom view of a second variant of the condensing section for the pressure difference driven heat spreader according to the third embodiment of the present invention.
Figure 6A:
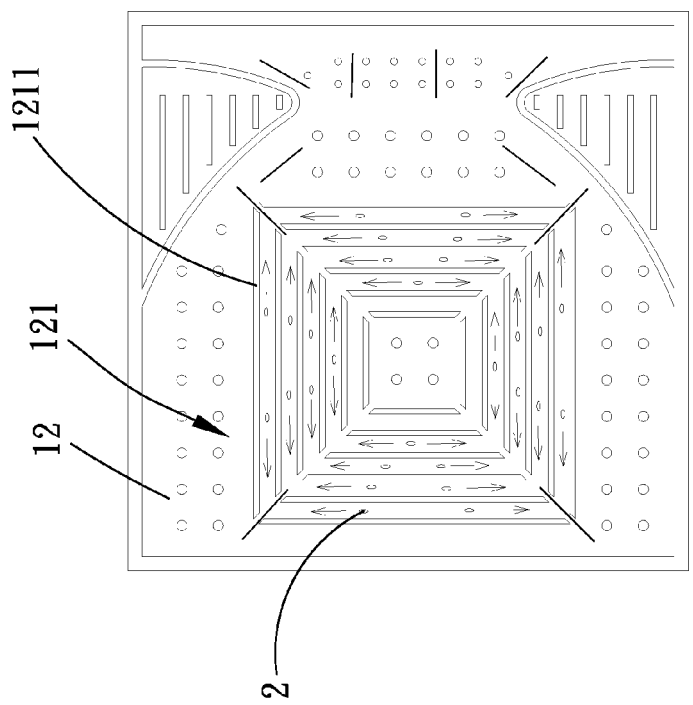
FIG. 6a is a top view of a second variant of the vaporizing section for the pressure difference driven heat spreader according to the third embodiment of the present invention.
Figure 7B:
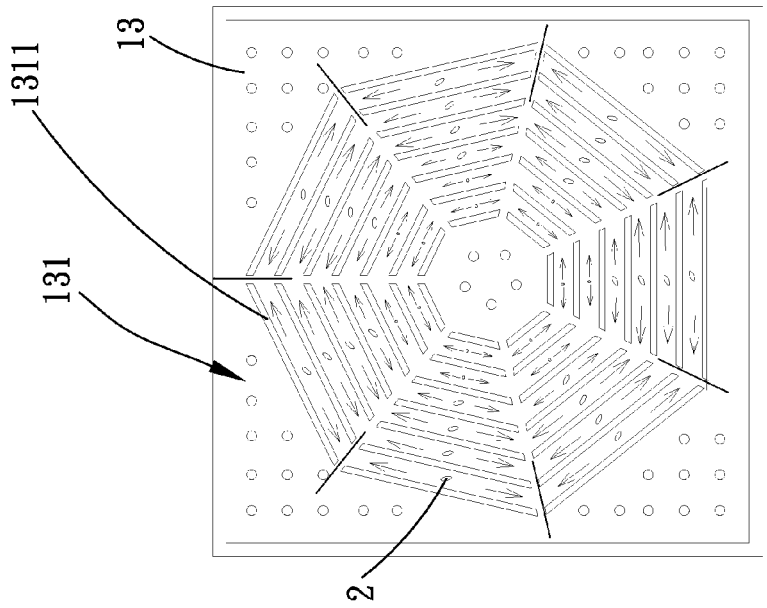
FIG. 7b is a bottom view of a third variant of the condensing section for the pressure difference driven heat spreader according to the third embodiment of the present invention.
Figure 7A:
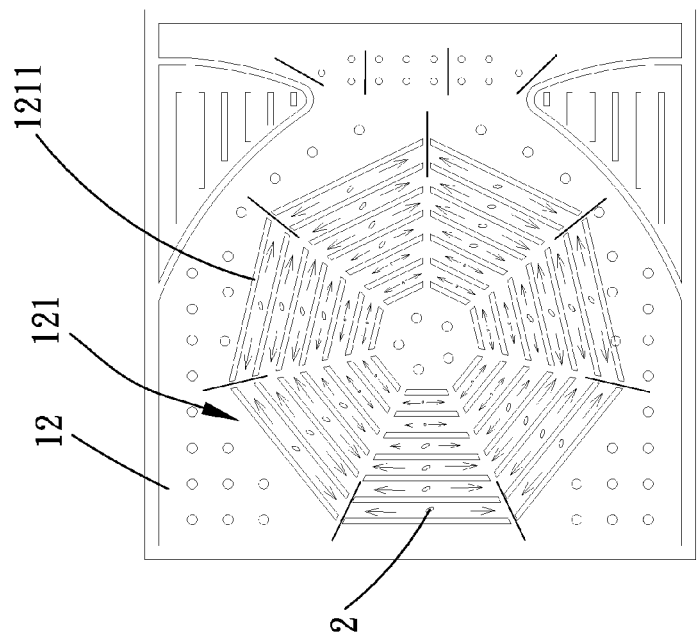
FIG. 7a is a top view of a third variant of the vaporizing section for the pressure difference driven heat spreader according to the third embodiment of the present invention.
Figure 8A:
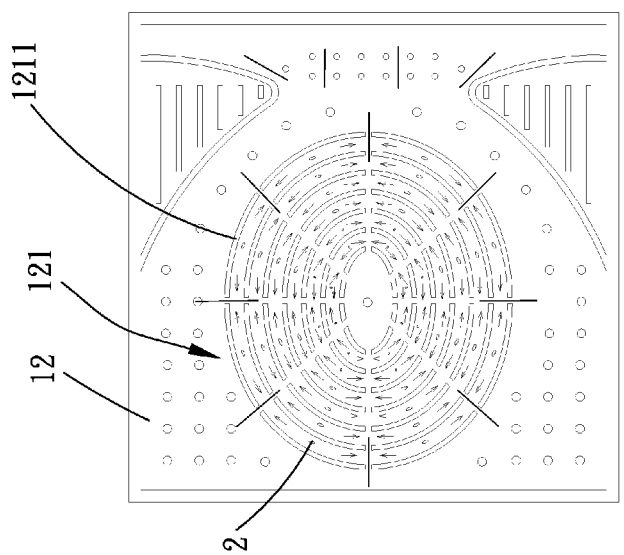
FIG. 8a is a top view of a fourth variant of the vaporizing section for the pressure difference driven heat spreader according to the third embodiment of the present invention.
Figure 8B:
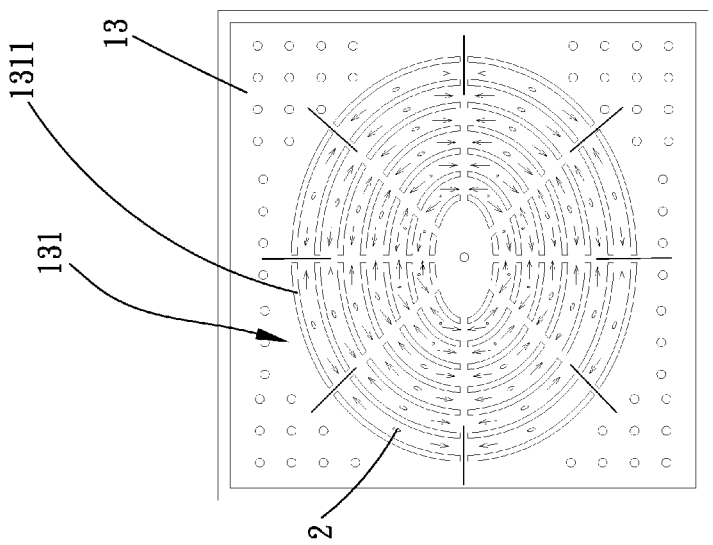
FIG. 8b is a bottom view of a fourth variant of the condensing section for the pressure difference driven heat spreader according to the third embodiment of the present invention.
Figure 9B:
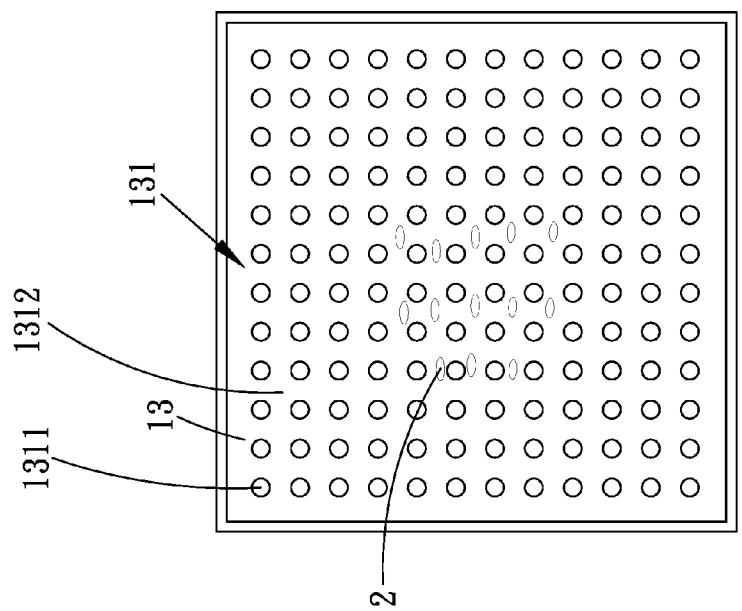
FIG. 9b is a bottom view of a condensing section for the pressure difference driven heat spreader according to the fourth embodiment of the present invention.
Figure 9A:
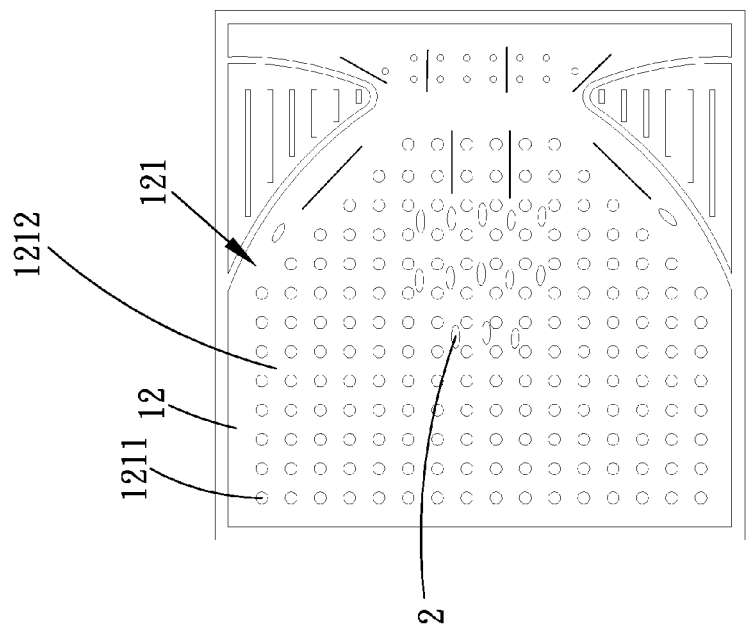
FIG. 9a is a top view of a vaporizing section for a pressure difference driven heat spreader according to a fourth embodiment of the present invention.
Figure 9D:
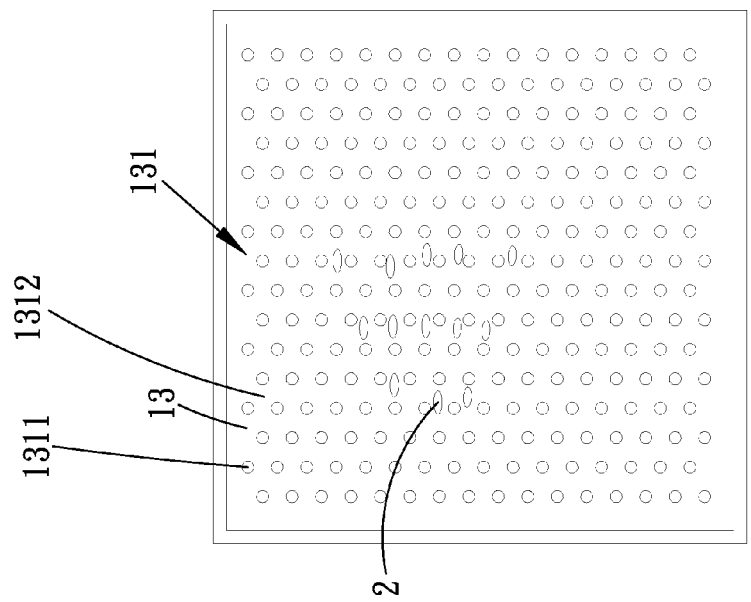
FIG. 9d is a bottom view of a first variant of the condensing section for the pressure difference driven heat spreader according to the fourth embodiment of the present invention.
Figure 9C:
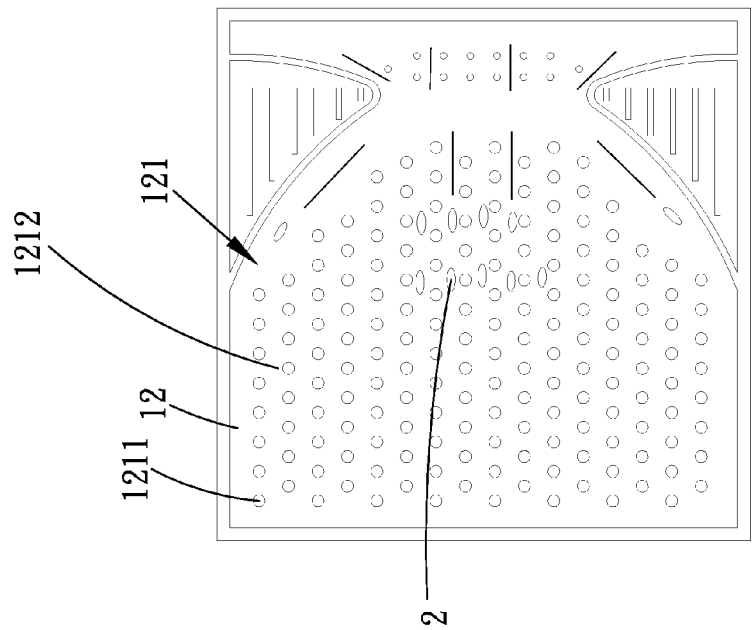
FIG. 9c is a top view of a first variant of the vaporizing section for the pressure difference driven heat spreader according to the fourth embodiment of the present invention.
Figure 10B:
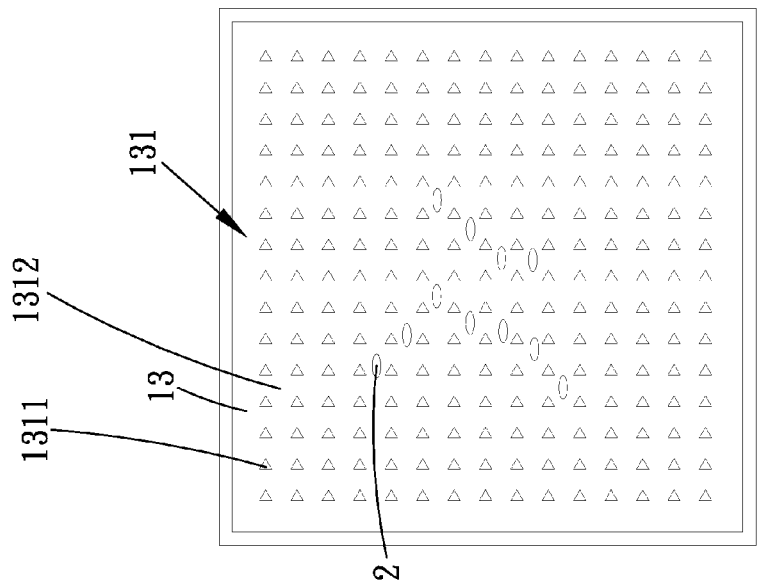
FIG. 10b is a bottom view of a second variant of the condensing section for the pressure difference driven heat spreader according to the fourth embodiment of the present invention.
Figure 10A:
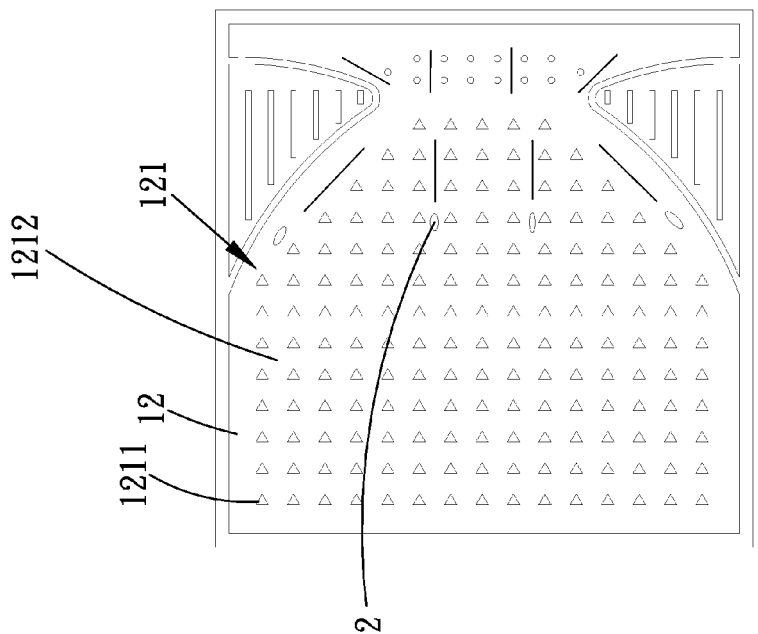
FIG. 10a is a top view of a second variant of the vaporizing section for the pressure difference driven heat spreader according to the fourth embodiment of the present invention.
Figure 10C:
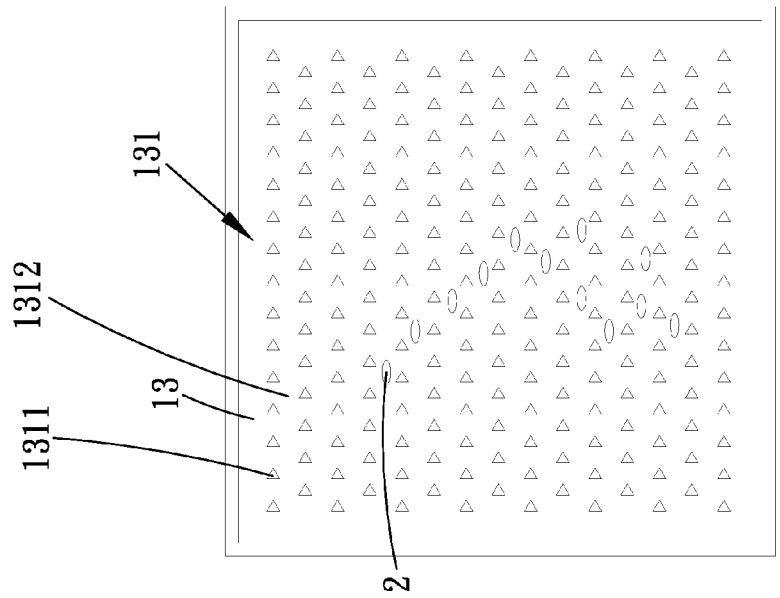
FIG. 10c is a top view of a third variant of the vaporizing section for the pressure difference driven heat spreader according to the fourth embodiment of the present invention.
Figure 10D:
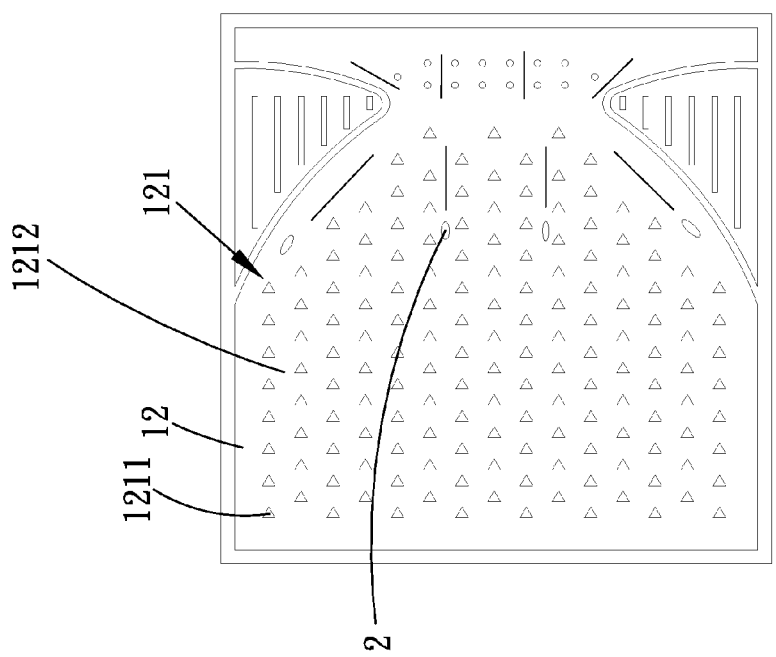
FIG. 10d is a bottom view of a third variant of the condensing section for the pressure difference driven heat spreader according to the fourth embodiment of the present invention.
Figure 11B:
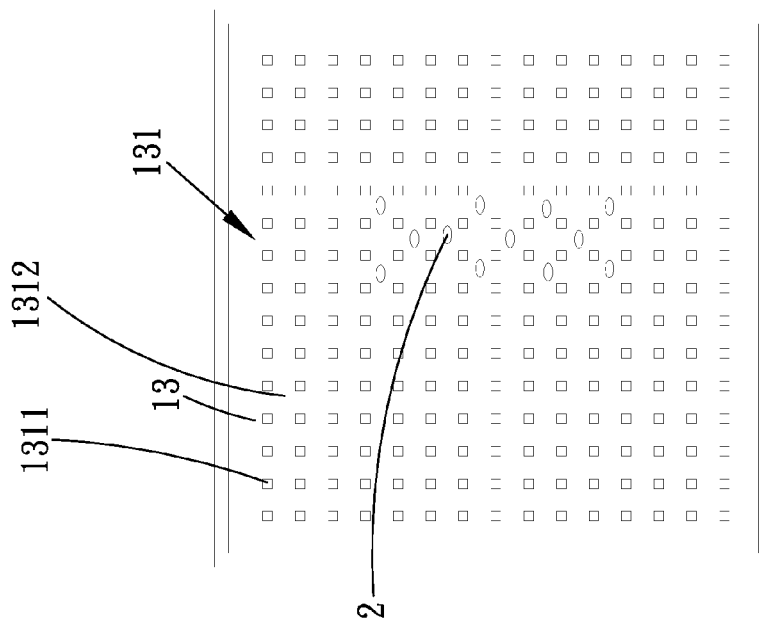
FIG. 11b is a bottom view of a fourth variant of the condensing section for the pressure difference driven heat spreader according to the fourth embodiment of the present invention.
Figure 11A:
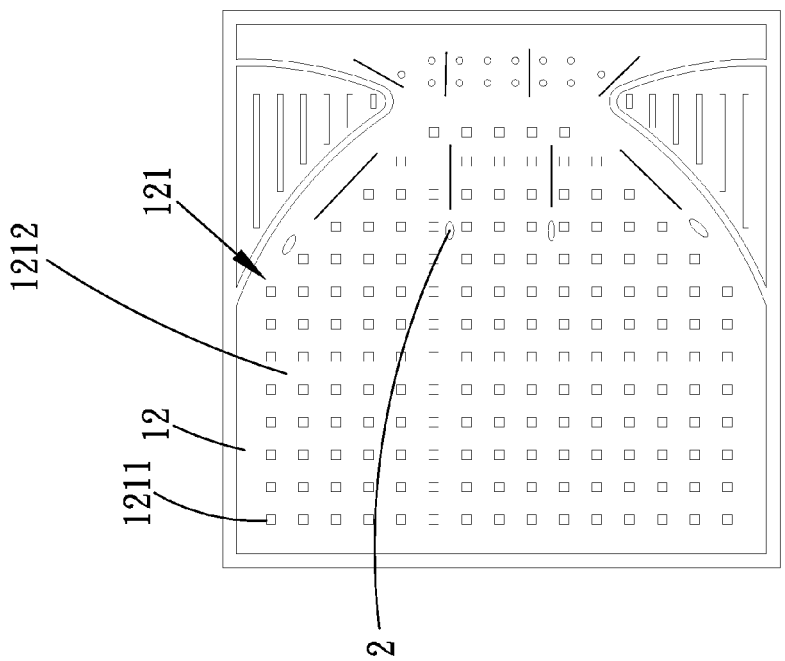
FIG. 11a is a top view of a fourth variant of the vaporizing section for the pressure difference driven heat spreader according to the fourth embodiment of the present invention.
Figure 11D:
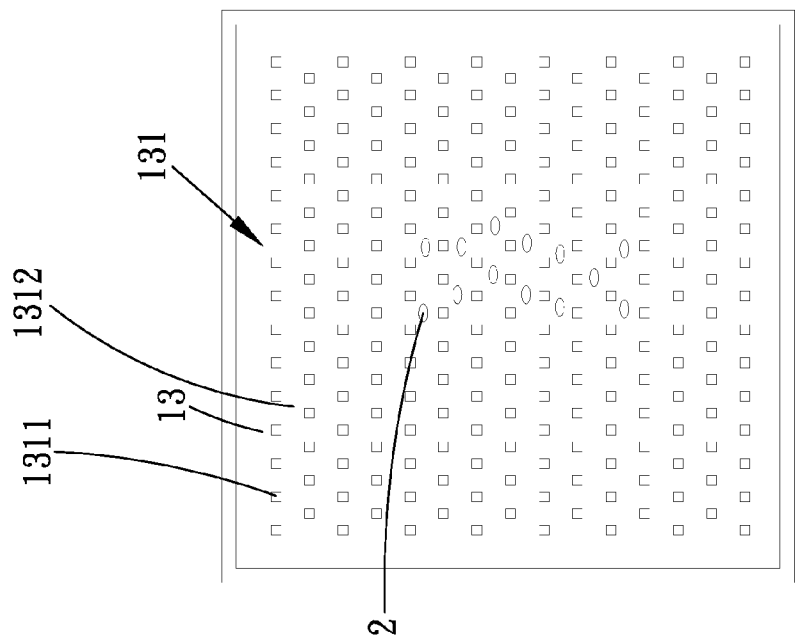
FIG. 11d is a bottom view of a fifth variant of the condensing section for the pressure difference driven heat spreader according to the fourth embodiment of the present invention.
Figure 11C:
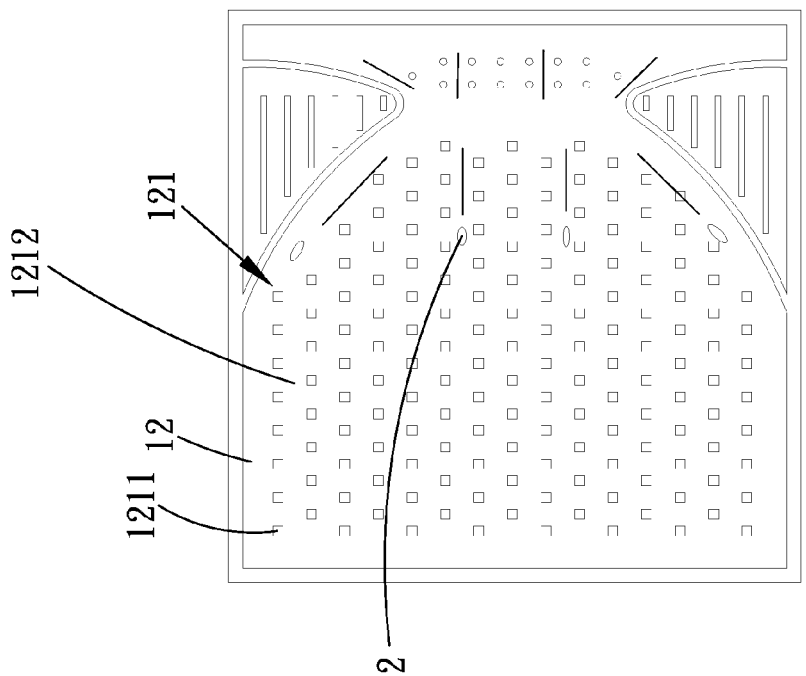
FIG. 11c is a top view of a fifth variant of the vaporizing section for the pressure difference driven heat spreader according to the fourth embodiment of the present invention.
Figure 12A:
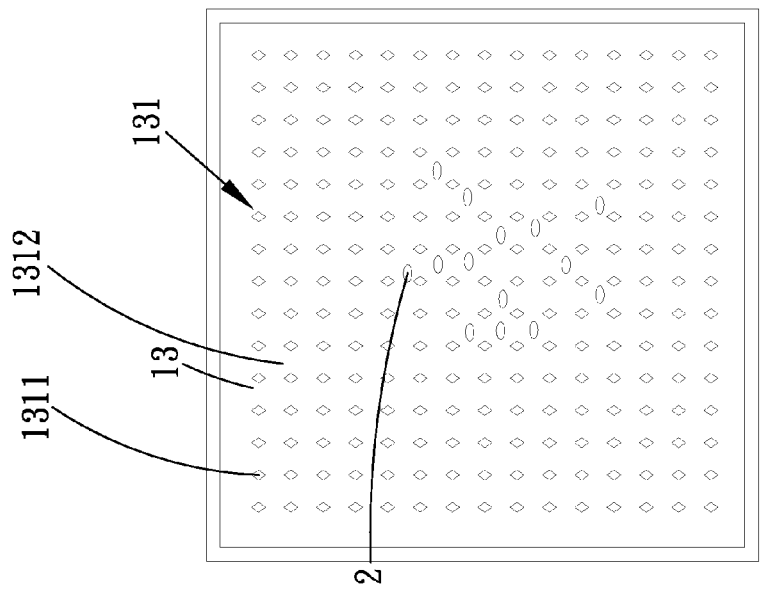
FIG. 12a is a top view of a sixth variant of the vaporizing section for the pressure difference driven heat spreader according to the fourth embodiment of the present invention.
Figure 12B:
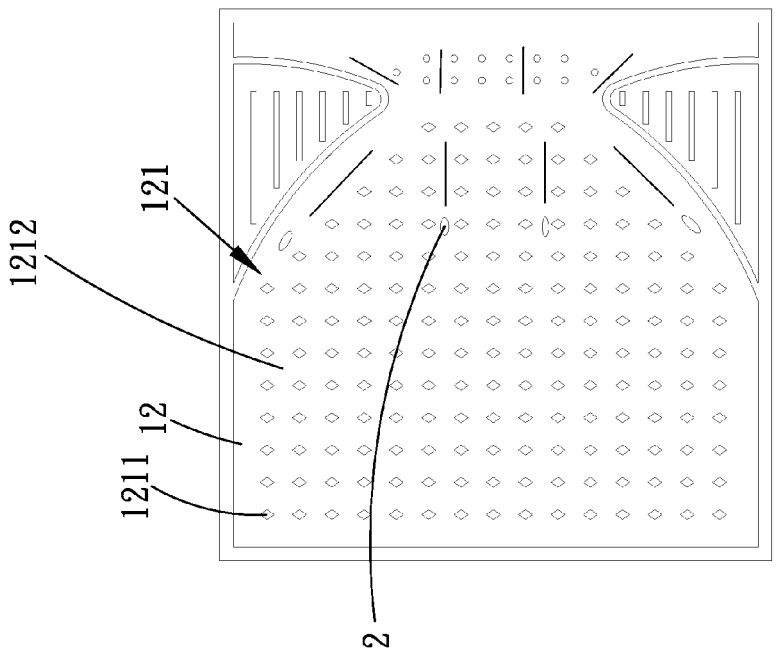
FIG. 12b is a bottom view of a sixth variant of the condensing section for the pressure difference driven heat spreader according to the fourth embodiment of the present invention.
Figure 12D:
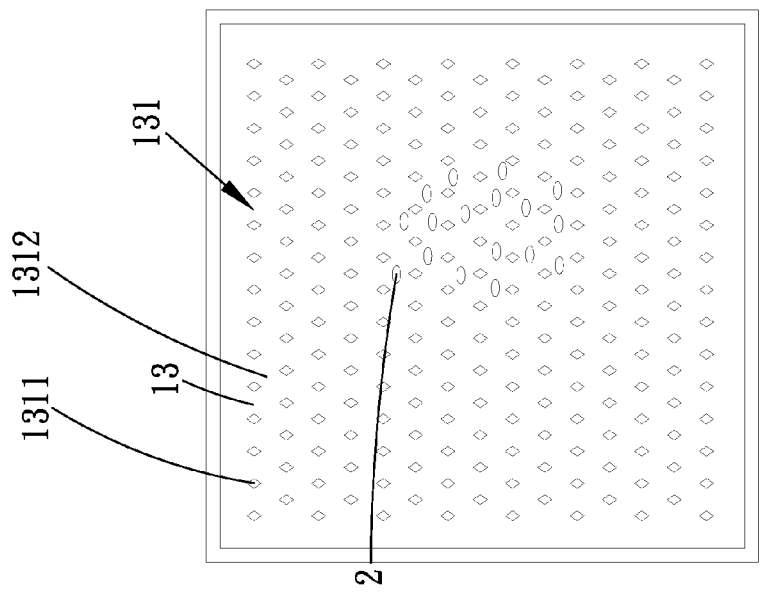
FIG. 12d is a bottom view of a seventh variant of the condensing section for the pressure difference driven heat spreader according to the fourth embodiment of the present invention.
Figure 12C:
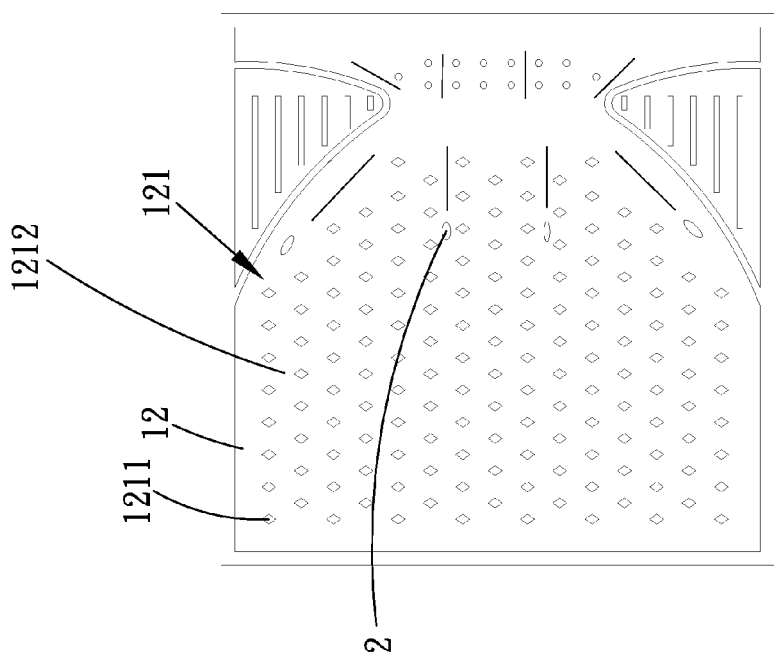
FIG. 12c is a top view of a seventh variant of the vaporizing section for the pressure difference driven heat spreader according to the fourth embodiment of the present invention.
Figure 13B:
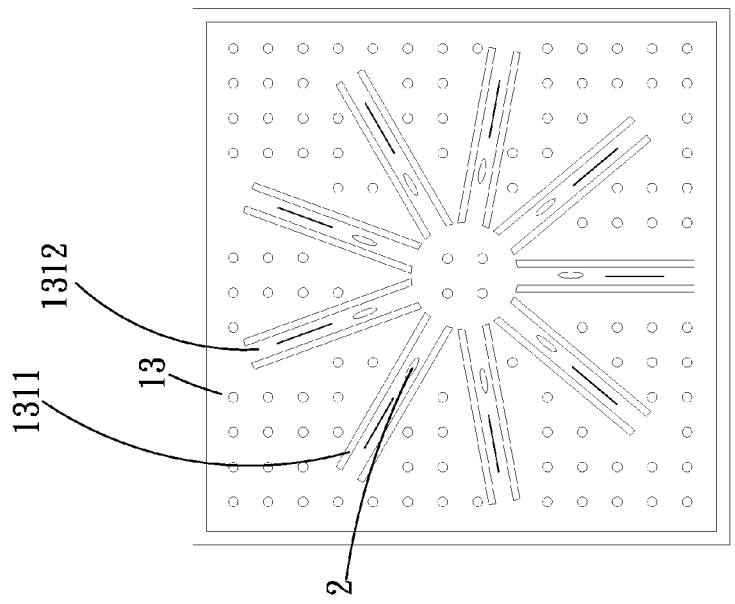
FIG. 13b is a bottom view of a condensing section for the pressure difference driven heat spreader according to the fifth embodiment of the present invention.
Figure 13A:
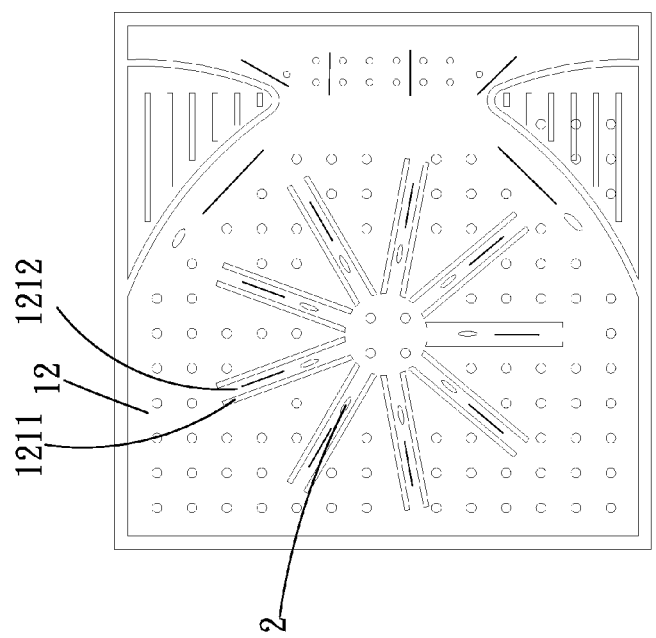
FIG. 13a is a top view of a vaporizing section for a pressure difference driven heat spreader according to a fifth embodiment of the present invention.

The annularly arrayed and spaced first and second flow-guiding members 1211, 1311 are not necessarily to form a plurality of concentric circles. For example, the first and the second flow-guiding portions 121, 131 can be otherwise a plurality of concentric triangles, as shown in FIGS. 5a and 5b, respectively; or a plurality of concentric rectangles, as shown in FIGS. 6a and 6b, respectively; or a plurality of concentric irregular shapes, as shown in FIGS. 7a and 7b, respectively; or a plurality of concentric oblongs, as shown in FIGS. 8a and 8b, respectively, while the same heat transfer effect can be achieved with these differently arrayed first and the second flow-guiding portions 121, 131.

Please refer to FIGS. 9a-9d, 10a-10d, 11a-11d, and 12a-12d, in which some variants of the vaporizing and the condensing section 12, 13 for a pressure difference driven heat spreader according to a fourth embodiment of the present invention are shown. Since the fourth embodiment is generally similar to the first and preferred embodiment in a part of the structure and the component connection thereof, these similar portions are not repeatedly described in details. The fourth embodiment is different from the first and preferred embodiment in that each of the first flow-guiding members 1211 of the first flow-guiding portions 121 of the vaporizing section 12 is a protrusion. The protrusions forming the first flow-guiding members 1211 are arrayed to space from one another in both longitudinal and transverse directions, so that a plurality of first flow passages 1212 are formed between adjacent protrusions. The fourth embodiment is also different from the first and preferred embodiment in that each of the second flow-guiding members 13311 of the second flow-guiding portions 131 of the condensing section 13 is a protrusion. The protrusions forming the second flow-guiding members 1311 are arrayed to space from one another in both longitudinal and transverse directions, so that a plurality of second flow passages 1312 are formed between adjacent protrusions. The protrusions can be round in shape, and can be parallelly arrayed to equally space from one another or be arrayed in staggered relation, as shown in FIGS. 9a-9b and FIGS. 9c-9d, respectively. The protrusions can also be triangular in shape, and can be parallelly arrayed and equally spaced or be arrayed in staggered relation, as shown in FIGS. 10a-10b and FIGS. 10c-10d, respectively. The protrusions can also be rectangular in shape, and can be parallelly arrayed and equally spaced or be arrayed in staggered relation, as shown in FIGS. 11a-11b and FIGS. 11c-11d, respectively. Or, the protrusions can be diamond in shape, and can be parallelly arrayed and equally spaced or be arrayed in staggered relation, as shown in FIGS. 12a-12b and FIGS. 12c-12d, respectively. The protrusions can also be any other different geometrical shapes.

Please refer to FIGS. 13a-13b and 14a-14b, in which some variants of the vaporizing section 12 and the condensing section 13 for a pressure difference driven heat spreader according to a fifth embodiment of the present invention are shown. Since the fifth embodiment is generally similar to the first and preferred embodiment in a part of the structure and the component connection thereof, these similar portions are not repeatedly described in details. The fifth embodiment is different from the first and preferred embodiment in that each of the first flow-guiding members 1211 is an elongated rib. The elongated ribs forming the first flow-guiding members 1211 are arrayed to space from one another, and are radially outward extended in the vaporizing section 12. The first flow passages 1212 are respectively formed between a pair of spaced first flow-guiding members 1211. The fifth embodiment is also different from the first and preferred embodiment in that each of the second flow-guiding members 1311 is an elongated rib. The elongated ribs forming the second flow-guiding members 1311 are arrayed to space from one another, and are radially outward extended in the condensing section 13. The second flow passages 1312 are respectively formed between a pair of spaced second flow-guiding members 1311.

Figure 14B:
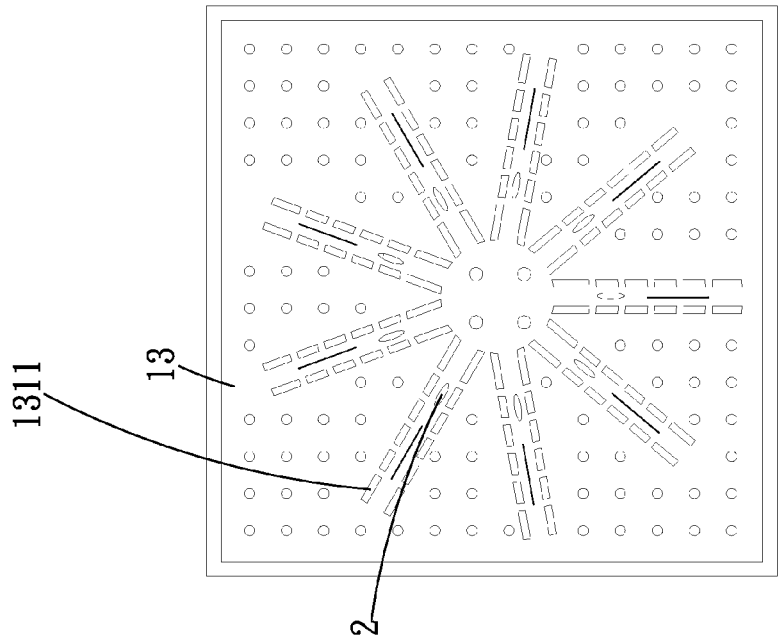
FIG. 14b is a bottom view of a variant of the condensing section for the pressure difference driven heat spreader according to the fifth embodiment of the present invention.
Figure 14A:
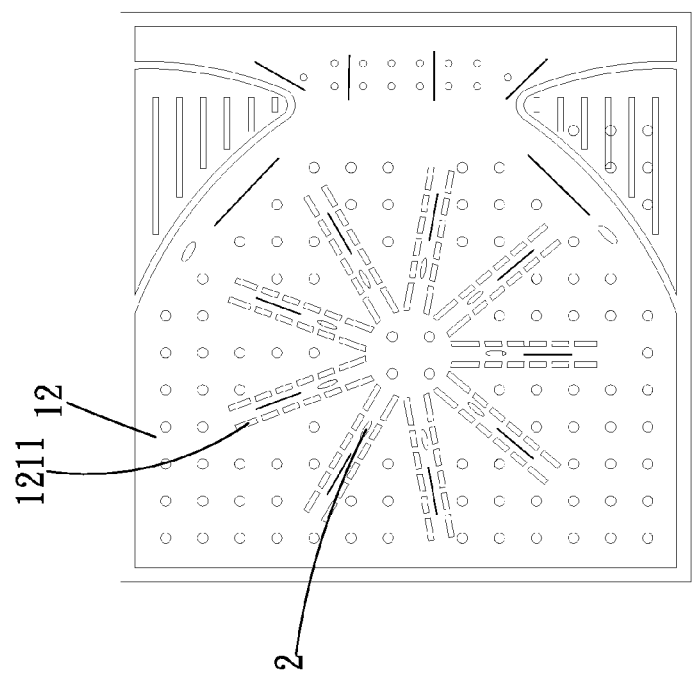
FIG. 14a is a top view of a variant of the vaporizing section for the pressure difference driven heat spreader according to the fifth embodiment of the present invention.

In a variant of the vaporizing section 12 and the condensing section 13 for the fifth embodiment of the present invention, the first flow-guiding members 1211 are also longitudinally discontinuously arranged when being arrayed to radially outward extend in the vaporizing section 12, as shown in FIG. 14a; and the second flow-guiding members 1311 are also longitudinally discontinuously arranged when being arrayed to radially outward extend in the condensing section 13, as shown in FIG. 14b.

Figure 15B:
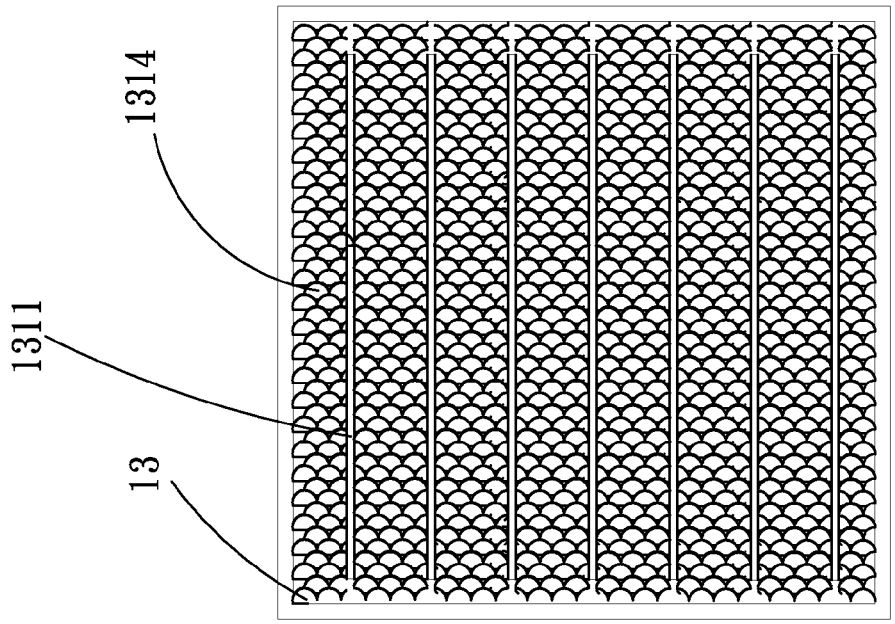
FIG. 15b is a bottom view of a further variant of the condensing section for the pressure difference driven heat spreader according to the first and preferred embodiment of the present invention.
Figure 15A:
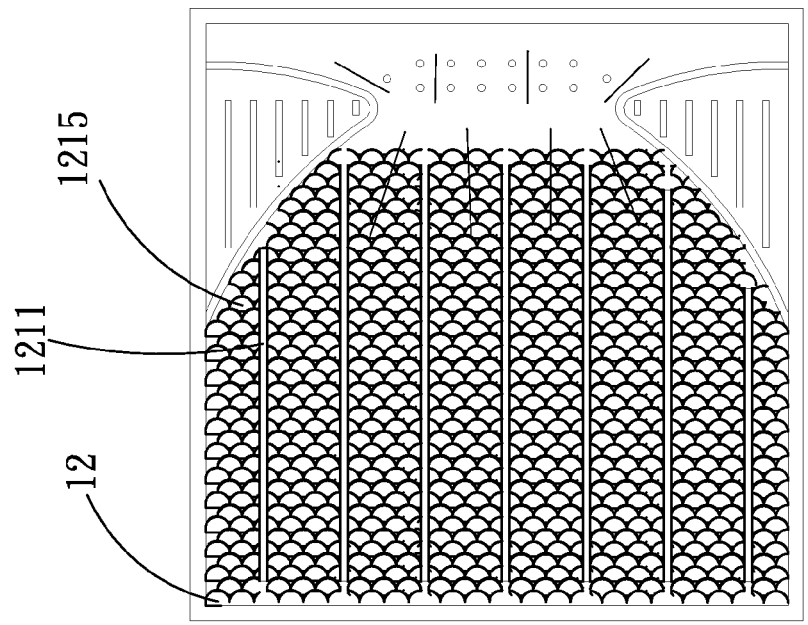
FIG. 15a is a top view of a further variant of the vaporizing section for the pressure difference driven heat spreader according to the first and preferred embodiment of the present invention.

Please refer to FIGS. 15a and 15b. As shown, in the first and preferred embodiment of the present invention, a plurality of recesses 1215, 1314 can be formed between the adjacent first flow-guiding members 1211 and the adjacent second flow-guiding members 1311, respectively. Each of the recesses 1215, 1314 can be in the form of, for example, a circle, a rectangle, a triangle, a fish scale, or any other geometrical shape. In the illustrated embodiment, the recesses are in the form of and arrayed as fish scales without being limited thereto. The recesses 1215, 1314 can be equally or unequally spaced from one another when being arrayed. Of course, the recesses 1215, 1314 can also be provided between the first flow-guiding members 1211 and between the second flow-guiding members 1311 in the second, third, fourth, and fifth embodiments of the present invention.

Please refer to FIGS. 1a through 14b at the same time. As shown, the first and preferred embodiment and the second, the third, the fourth, and the fifth embodiment of the present invention provide a working fluid circulating and cooling technique for a two-phase pressure difference driven heat spreader. This is a type of self-driven circulation. The working fluid used in the heat spreader can be a coolant selected from any one of purified water, methanol, acetone, and R134A. The chamber 11 of the pressure difference driven heat spreader is in a vacuum state. Thus, the working fluid filled in the chamber 11 has a saturation temperature, i.e. a boiling point, at 20~30° C. Vapor bubbles 2 formed in the chamber 11 gather at the free ends 1212a of the first flow-guiding passages 1212 in the vaporizing section 12 and then flow through the free zone 1214, bringing the pressure thereof to drop and thereby producing a pressure gradient in the chamber 11 needed to drive steam-water circulation in the heat spreader. In addition, in the condensing section 13, a local negative pressure suction formed due to the suddenly raised specific volume of steam condensate is helpful in the steam-water circulation.

Being driven by the pressure gradient, the condensed liquid-state working fluid circulates from the condensing section 13 back to the vaporizing section 12. By taking advantage of the high coefficient of thermal convection occurred at boiling and condensing, the pressure difference driven heat spreader can have largely improved temperature uniformity and reduced thermal resistance.

That is, heat produced by a heat-producing element (not shown) in an electronic system is first transferred to a surface of the main body 1 corresponding to the vaporizing section 12 and then further transferred to the first flow passages 1212 of the vaporizing section 12, bringing part of the working fluid in the first flow passages 1212 to boil and become vaporized to produce vapor bubbles 2. When the vapor bubbles 2 are overheated to produce pressure, the working fluid is pushed by the pressure toward the condensing section 13 to release heat and become condensed thereat. The condensed working fluid flows back to the vaporizing section 12 via a low pressure zone of the condensing section 13 communicating with the vaporizing section 12. The working fluid flowed back to the vaporizing section 12 absorbs heat at the vaporizing section 12 that is in contact with the heat-producing element (not shown) and keeps circulating in the heat spreader.

In recent years, many big-scale heat-dissipation apparatus manufacturers have devoted in various kinds of water-cooling techniques, particularly the active water cooling techniques, in which pumps are used to provide the dynamic force needed to enable the circulation of water in a pipeline system. However, the water-cooling techniques are subject to the reliability and the service life of the pump valves. On the other hand, the circulation cooling technique for the two-phase pressure difference driven heat spreader proposed by the present invention has the advantages of (1) having not any movable part in the system to thereby avoid the problems of part wearing and limited part service life, and (2) not requiring any external pump and internal wick structure to thereby enable reduced power consumption and elimination of operating noise.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A pressure difference driven heat spreader, comprising:
a main body;
a chamber being defined in the main body;
a lower vaporizing section being arranged in the chamber, and including a plurality of first flow-guiding portions and a guiding portion; the first flow-guiding portions each being formed from a plurality of arrayed and spaced first flow-guiding members, such that at least one first flow passage is formed between any two adjacent first flow-guiding members; the first flow passages each having at least one end being a free end communicating with a free zone; the guiding portion having a first guiding member and a second guiding member; the first and second generally V-shaped guiding members being located between the first flow-guiding members and the free zone and extended respectively from two lateral walls of the chamber toward a center to define a necked opening; and the necked opening being positioned between the vaporizing section and the free zone;
an upper condensing section being arranged in the chamber opposite to the vaporizing section, and including a plurality of second flow-guiding portions; the second flow-guiding portions each being formed from a plurality of arrayed and spaced second flow-guiding members, such that at least one second flow passage is formed between any two adjacent second flow-guiding members;
an interconnecting section comprising a member arranged between the vaporizing section and the condensing section to divide the vaporizing section and the condensing section into two independent sections at two sides of the interconnecting section, respectively, said member including at least one set of first communicating holes near a first end thereof and at least one set of second communicating holes near a second end thereof; and the sets of first and second communicating holes being respectively disposed in the free end and the free zone, and communicating the vaporizing section with the condensing section; and
a working fluid, wherein the working fluid in the first flow passages of the vaporizing section is heated, and part of the working fluid boils and becomes vaporized to produce vapor bubbles, then when the vapor bubbles become overheated and produce pressure, the structure of the interconnecting section causes the working fluid to be pushed by the pressure toward and into the condensing section to release heat and condense, finally, the condensed working fluid is caused to flow back to the vaporizing section via a low pressure zone of the condensing section communicating with the vaporizing section to complete a continuous circulation path.

2. The pressure difference driven heat spreader as claimed in claim 1, wherein the first flow-guiding members are respectively an elongated rib; the elongated ribs forming the first flow-guiding members being transversely arrayed to space from one another, and the first flow passages being respectively formed between two adjacent elongated ribs.

3. The pressure difference driven heat spreader as claimed in claim 2, wherein the first flow-guiding members are also longitudinally arrayed to space from one another.

4. The pressure difference driven heat spreader as claimed in claim 1, wherein the second flow-guiding members are respectively an elongated rib; the elongated ribs forming the second flow-guiding members being transversely arrayed to space from one another, and the second flow passages being respectively formed between two adjacent elongated ribs.

5. The pressure difference driven heat spreader as claimed in claim 4, wherein the second flow-guiding members are also longitudinally arrayed to space from one another.

6. The pressure difference driven heat spreader as claimed in claim 1, wherein each of the first flow-guiding members is a substantially V-shaped rib having a first vertex angle, a first edge and a second edge, and the first and the second edge meeting each other at the first vertex angle; the first flow passages being respectively formed between any two adjacent V-shaped ribs, and a first space being left between two adjacent first flow-guiding portions.

7. The pressure difference driven heat spreader as claimed in claim 6, wherein each of the first flow-guiding members includes a plurality of discontinuously arrayed first edges and a plurality of discontinuously arrayed second edges.

8. The pressure difference driven heat spreader as claimed in claim 1, wherein each of the second flow-guiding members is a substantially V-shaped rib having a second vertex angle, a third edge and a fourth edge, and the third and the fourth edge meeting each other at the second vertex angle; the second flow passages being formed between any two adjacent V-shaped ribs, and a second space being left between two adjacent second flow-guiding portions.

9. The pressure difference driven heat spreader as claimed in claim 8, wherein each of the second flow-guiding members includes a plurality of discontinuously arrayed third edges and a plurality of discontinuously arrayed fourth edges.

10. The pressure difference driven heat spreader as claimed in claim 1, wherein each of the first flow-guiding members of the first flow-guiding portions is a rib, and the ribs forming the first flow-guiding members being discontinuously arrayed a center to form a plurality of concentric circles; and wherein each of the second flow-guiding members of the second flow-guiding portions is a rib, and the ribs forming the second flow-guiding members being discontinuously arrayed around a center to form a plurality of concentric circles.

11. The pressure difference driven heat spreader as claimed in claim 1, wherein each of the first flow-guiding members of the first flow-guiding portions is a rib, and the ribs forming the first flow-guiding members being discontinuously arrayed around a center to form a plurality of concentric triangles; and wherein each of the second flow-guiding members of the second flow-guiding portions is a rib, and the ribs forming the second flow-guiding members being discontinuously arrayed a center to form a plurality of concentric triangles.

12. The pressure difference driven heat spreader as claimed in claim 1, wherein each of the first flow-guiding members of the first flow-guiding portions is a rib, and the ribs forming the first flow-guiding members being discontinuously arrayed around a center to form a plurality of concentric rectangles; and wherein each of the second flow-guiding members of the second flow-guiding portions is a rib, and the ribs forming the second flow-guiding members being discontinuously arrayed a center to form a plurality of concentric rectangles.

13. The pressure difference driven heat spreader as claimed in claim 1, wherein each of the first flow-guiding members of the first flow-guiding portions is a rib, and the ribs forming the first flow-guiding members being discontinuously arrayed a center to form a plurality of concentric irregular shapes; and wherein each of the second flow-guiding members of the second flow-guiding portions is a rib, and the ribs forming the second flow-guiding members being discontinuously arrayed around a center to form a plurality of concentric irregular shapes.

14. The pressure difference driven heat spreader as claimed in claim 1, wherein each of the first flow-guiding members is an elongated rib, the elongated ribs forming the first flow-guiding members being arrayed to space from one another and radially outward extend in the vaporizing section, and the first flow passages are respectively formed between a pair of two adjacent first flow-guiding members; and wherein each of the second flow-guiding members is an elongated rib, the elongated ribs forming the second flow-guiding members being arrayed to space from one another and radially outward extend in the condensing section, and the second flow passages are respectively formed between a pair of two adjacent second flow-guiding members.

15. The pressure difference driven heat spreader as claimed in claim 14, wherein the first flow-guiding members are also longitudinally discontinuously arranged when being arrayed to radially outward extend in the vaporizing section; and wherein the second flow-guiding members are also longitudinally discontinuously arranged when being arrayed to radially outward extend in the condensing section.

16. The pressure difference driven heat spreader as claimed in claim 1, further comprising a plurality of recesses formed between the adjacent first flow-guiding members and between the adjacent second flow-guiding members.

17. The pressure difference driven heat spreader as claimed in claim 16, wherein each of the recesses is in a shape selected from the group consisting of a circle, a rectangle, a triangle, a fish scale, and any other geometrical shape.

18. The pressure difference driven heat spreader as claimed in claim 1, wherein each of the first flow-guiding members of the first flow-guiding portions is a protrusion, and the protrusions forming the first flow-guiding members being arrayed to space from one another in both longitudinal and transverse directions, so that the first flow passages are respectively formed between the adjacent protrusions; and wherein each of the second flow-guiding members of the second flow-guiding portions is a protrusion, and the protrusions forming the second flow-guiding members being arrayed to space from one another in both longitudinal and transverse directions, so that the second flow passages are respectively formed between the adjacent protrusions.

19. The pressure difference driven heat spreader as claimed in claim 18, wherein each of the protrusions is in a shape selected from the group consisting of a circle, a triangle, a rectangle, a trapezoid, a diamond, and any other geometrical shape.

* * * * *